United States Patent
Zheng et al.

(10) Patent No.: US 10,551,745 B2
(45) Date of Patent: Feb. 4, 2020

(54) PHOTOPATTERNABLE COMPOSITIONS AND METHODS OF FABRICATING TRANSISTOR DEVICES USING SAME

(71) Applicant: Flexterra, Inc., Skokie, IL (US)

(72) Inventors: Yan Zheng, Skokie, IL (US); Yan Hu, Chicago, IL (US); Wei Zhao, New York, NY (US); Antonio Facchetti, Chicago, IL (US)

(73) Assignee: Flexterra, Inc., Skoie, IL (US)

( * ) Notice: Subject to any disclaimer, the term of this patent is extended or adjusted under 35 U.S.C. 154(b) by 79 days.

(21) Appl. No.: 15/495,928

(22) Filed: Apr. 24, 2017

(65) Prior Publication Data

US 2017/0227846 A1 Aug. 10, 2017

Related U.S. Application Data

(63) Continuation of application No. PCT/US2015/057143, filed on Oct. 23, 2015.

(60) Provisional application No. 62/068,612, filed on Oct. 24, 2014.

(51) Int. Cl.

| | | |
|---|---|---|
| G03F 7/40 | (2006.01) |
| G03F 7/075 | (2006.01) |
| G03F 7/038 | (2006.01) |
| G03F 7/004 | (2006.01) |
| G03F 7/16 | (2006.01) |
| G03F 7/20 | (2006.01) |
| G03F 7/32 | (2006.01) |
| G03F 7/42 | (2006.01) |
| H01L 21/02 | (2006.01) |
| H01L 29/786 | (2006.01) |
| H01L 51/05 | (2006.01) |

(52) U.S. Cl.
CPC .............. *G03F 7/40* (2013.01); *G03F 7/0045* (2013.01); *G03F 7/0046* (2013.01); *G03F 7/038* (2013.01); *G03F 7/0757* (2013.01); *G03F 7/162* (2013.01); *G03F 7/168* (2013.01); *G03F 7/2004* (2013.01); *G03F 7/32* (2013.01); *G03F 7/422* (2013.01); *H01L 21/02118* (2013.01); *H01L 21/02334* (2013.01); *H01L 21/02348* (2013.01); *H01L 29/7869* (2013.01); *H01L 51/0512* (2013.01)

(58) Field of Classification Search
CPC ........................................................ G03F 7/40
See application file for complete search history.

(56) References Cited

U.S. PATENT DOCUMENTS

| | | |
|---|---|---|
| 5,516,624 A | 5/1996 | Schlosser |
| 6,335,539 B1 | 1/2002 | Dimitrakopoulos et al. |
| 7,670,870 B2 | 3/2010 | Izumi et al. |
| 2003/0044688 A1 | 3/2003 | Kang et al. |
| 2009/0101892 A1 | 4/2009 | Dimitrakopoulos et al. |
| 2011/0175089 A1 | 7/2011 | Zheng et al. |
| 2013/0113082 A1* | 5/2013 | Enomoto .............. G03F 7/0382 257/618 |
| 2014/0154471 A1 | 6/2014 | Kodama et al. |
| 2014/0217395 A1 | 8/2014 | Facchetti et al. |

FOREIGN PATENT DOCUMENTS

| | | |
|---|---|---|
| JP | S6165235 A | 4/1986 |
| JP | 2003248311 A | 9/2003 |
| JP | 3543020 B2 | 7/2004 |
| JP | 2008203349 A | 9/2008 |
| JP | 5344943 B2 | 11/2013 |
| WO | WO 2010/057984 A2 | 5/2010 |
| WO | WO 2016/065276 A1 | 4/2016 |

OTHER PUBLICATIONS

DiBenedetto, Sara A. et al., "Molecdular Self-Assembled Monolayers and Multilayers for Organic and Unconventional Inorganic Thin-Film Transistor Applications," Adv. Mater.2009, 21, 1407-1433.

Piliego, Claudia et al., "High Electron Mobility and Ambient Stability in Solution-Processed Perylene-Based Organic Field-Effect Transistors," Adv. Mater. 2009, 21, 1573-1576.

International Search Report issued in parent, co-pending International Patent Application No. PCT/US2015/057143, European Patent Office, dated Feb. 24, 2016, 4 pages.

Written Opinion issued in parent, co-pending International Patent Application No. PCT/US2015/057143, European Patent Office, dated Feb. 24, 2016, 8 pages.

* cited by examiner

*Primary Examiner* — Kathleen Duda
(74) *Attorney, Agent, or Firm* — McDonnell Boehnen Hulbert & Berghoff LLP

(57) ABSTRACT

The present teachings relate to compositions for forming a negative-tone photopatternable dielectric material, where the compositions include, among other components, an organic filler and one or more photoactive compounds, and where the presence of the organic filler enables the effective removal of such photoactive compounds (after curing, and during or after the development step) which, if allowed to remain in the photopatterned dielectric material, would lead to deleterious effects on its dielectric properties.

23 Claims, 4 Drawing Sheets a)

b)

a)

b)

a)

b)

PHOTOPATTERNABLE COMPOSITIONS AND METHODS OF FABRICATING TRANSISTOR DEVICES USING SAME

CROSS-REFERENCE TO RELATED APPLICATIONS

This application is a continuation of International Application No. PCT/US2015/057143, filed on Oct. 23, 2015, which claims priority to and the benefit of the filing date of U.S. Provisional Patent Application Ser. No. 62/068,612 filed on Oct. 24, 2014, the entire disclosure of each of which is hereby expressly incorporated by reference herein for all uses and purposes.

BACKGROUND

Thin-film transistors (TFTs) based upon various organic and inorganic (e.g., metal oxide) semiconductors have been developed. To ensure good device performance, compatible materials for the layers (e.g., the gate dielectric layer, the passivation layer, and the etch-stop layer) adjacent to the semiconductor component are equally critical. While the function of these layers requires materials having different properties, it is generally desirable that these materials can be directly photopatterned without the use of a photoresist to simplify the overall manufacturing process, and in particular, to reduce the number of photolithography steps.

Most state-of-the-art photopatternable materials are based upon photocurable polymers and/or photopolymerizable compounds incorporating photosensitive moieties such as carbon-carbon double bonds, epoxides, Novolak/diazoquinones, or photogenerated acid groups. Often, these systems require one or more photoinitiators, photosensitizers, and/or photoacid generators to carry out the photochemical reactions efficiently. The presence of the photoinitiators, photosensitizers, or photoacid generators usually is not a concern if these photopatternable materials are used as photoresists, in which case, they are stripped off after the patterning step and are not incorporated as part of the final device. However, these systems will not be good material candidates as gate dielectrics (or other layers adjacent to the semiconductor layer) in a transistor device, because the photoinitiators, photosensitizers, or photoacid generators tend to promote interfacial charge trapping which can lead to deteriorated transistor characteristics such as threshold voltage shift, hysteresis, and increased current leakage.

Accordingly, there is a need in the art for photopatternable compositions that can be used to provide photopatterned dielectrics that are substantially free of any photoinitiators, photosensitizers, or photoacid generators, but at the same time can be solution-processed and cured efficiently.

SUMMARY

In light of the foregoing, the present teachings relate to compositions for forming a negative-tone photopatternable dielectric material, where the compositions include, among other components, an organic filler and one or more photoactive compounds, and where the presence of the organic filler enables the effective removal of such photoactive compounds (after curing and during or after the development step) which, if allowed to remain in the photopatterned dielectric material, would lead to deleterious effects on its dielectric properties.

Generally, the present composition includes one or more matrix-forming compounds, one or more photoactive compounds, an organic filler, and an organic solvent or solvent mixture, wherein the weight ratio of the organic filler to the matrix-forming compounds is between about 3:1 and about 1:4, and wherein the photoactive compounds are adapted to initiate, promote, and/or sensitize a photochemical reaction in which the matrix-forming compounds form a crosslinked matrix that is insoluble in the organic solvent or solvent mixture, and wherein the organic filler is inert in such photochemical reaction and is soluble or miscible in the organic solvent or solvent mixture both before and after such photochemical reaction. In various embodiments, the matrix-forming compounds can be present at about 5-30 wt % in the composition, the photoactive compounds can be present at about 8-40 wt % in the composition, the organic filler can be present at about 5-30 wt % in the composition, and the organic solvent or solvent mixture can be present at about 50-85 wt % in the composition. The photoactive compounds can be photoactive upon irradiation at wavelengths between about 200 nm and about 500 nm, and particularly, upon exposure to G (435.8 nm), H (404.7 nm) or I (365.4 nm) line irradiation.

In some embodiments, the organic filler has a minimum solubility of about 25 mg/mL in the organic solvent or solvent mixture. The organic solvent or solvent mixture can comprise an ester solvent, an alcohol solvent, a ketone solvent, or a combination thereof. The organic solvent or solvent mixture can comprise one or more of ethyl lactate (EL), ethyl 3-ethoxy propionate (EEP), propylene glycol methyl ether acetate (PGMEA), and methyl n-amyl ketone (MAK). The organic filler can be a compound having a molecular weight between about 200 g/mol and about 2500 g/mol, and/or a boiling point between about 200° C. and about 700° C. In certain embodiments, the organic filler can be a bis-methoxylated or bis-ethoxylated poly(alkylene glycol), or a fluorinated derivative thereof. For example, the organic filler can be a polyethylene glycol dimethyl ether having a number average molecular weight ($M_n$) of 200 g/mol, 250 g/mol, 300 g/mol, 400 g/mol, or 500 g/mol. In some embodiments, the organic filler can be a compound having a cyclic ring at one end and a lipophilic chain at the other end, wherein the lipophilic chain has at least 8 carbon atoms. For example, the organic filler can be selected from (±)-α-tocopherol, DL-α-tocopherol acetate, retinyl acetate, and retinyl palmitate.

In some embodiments, the matrix-forming compounds comprise oligomers or polymers functionalized with a photocrosslinkable group, the photocrosslinkable group being a functional group comprising a double bond, a triple bond, a heterocyclic addition-polymerizable group, or a precursor capable of in-situ formation of a double or triple bond or a heterocyclic addition-polymerizable radical. For example, the photocrosslinkable group can include a vinyl moiety, an allyl moiety, an ethynyl moiety, a dienyl moiety, an acrylate moiety, a cinnamate moiety, a coumarinyl moiety, a benzocyclobutane moiety, an epoxy or oxirane moiety, an oxetane moiety, or a thiirane moiety. The photocrosslinkable group can be attached as pendant group to a dielectric polymer selected from poly(vinyl phenol), poly(vinyl acetate), poly(vinyl alcohol), poly(acrylate), poly(methacrylate), poly(methyl methacrylate), polystyrene, poly(ethylene amine), polymaleimide, polyimide, polysulfone, siloxane polymer, phenol formaldehyde (Novolac) resin, a benzoxazole polymer, poly(oxadiazole), maleic anhydride polymer, and copolymers thereof. In these embodiments, the photoactive compounds can include a photoacid generator, a photosensitizer or both.

In some embodiments, the matrix-forming compounds comprise one or more photopolymerizable monomers or oligomers. For example, the one or more photopolymerizable monomers or oligomers can be selected from (i) monofunctional and/or polyfunctional acrylate monomers and oligomers, (ii) monofunctional and/or polyfunctional epoxy or epithio monomers and oligomers, (iii) monomeric styrene and oligomeric acrylates, (iv) thiol-ene monomers and oligomers, (v) acrylate- and/or epoxy-functionalized polyhedral oligomeric silsesquioxanes, (vi) monofunctional and/or polyfunctional maleimide monomers and oligomers, and (vii) mixtures thereof. In these embodiments, the photoactive compounds can include a photoinitiator and optionally, a photosensitizer. The composition further may include a co-initiator.

The present teachings also provide methods for forming a photopatterned dielectric component in a transistor device. The method generally includes depositing a photopatternable composition onto a substrate to provide a thin film, the photopatternable composition comprising one or more matrix-forming compounds, one or more photoactive compounds, an organic filler, and an organic solvent or solvent mixture; exposing the thin film to imagewise irradiation, thereby causing the one or more matrix-forming compounds in the exposed areas of the thin film to form a polymerized or crosslinked matrix that is insoluble in the organic solvent or solvent mixture; removing unexposed areas of the thin film with a developer to provide a photopatterned dielectric component; and rinsing the photopatterned dielectric component with the organic solvent or solvent mixture so that the photoactive compounds in the photopatterned dielectric component is less than about 5% of the weight percentage (wt %) of the photoactive compounds in the photopatternable composition. The method also can include a soft-baking step before irradiation. The soft-baking step can be performed at a low temperature (e.g., between about 100-150° C.) for a short period of time (e.g., between about 30 seconds and 5 minutes). The method also can include a hard-baking step after irradiation. The hard-baking step can be performed at a high temperature (e.g., at about 250-350° C.) and for about 10 minutes to 1 hour.

The present teachings further relate to a transistor having a patterned component, wherein the patterned component has less than 0.5 wt % of photoactive compounds and is prepared from a negative tone photoresist comprising at least 10 wt % of photoactive compounds.

The foregoing as well as other features and advantages of the present teachings will be more fully understood from the following figures, description, examples, and claims.

BRIEF DESCRIPTION OF THE DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
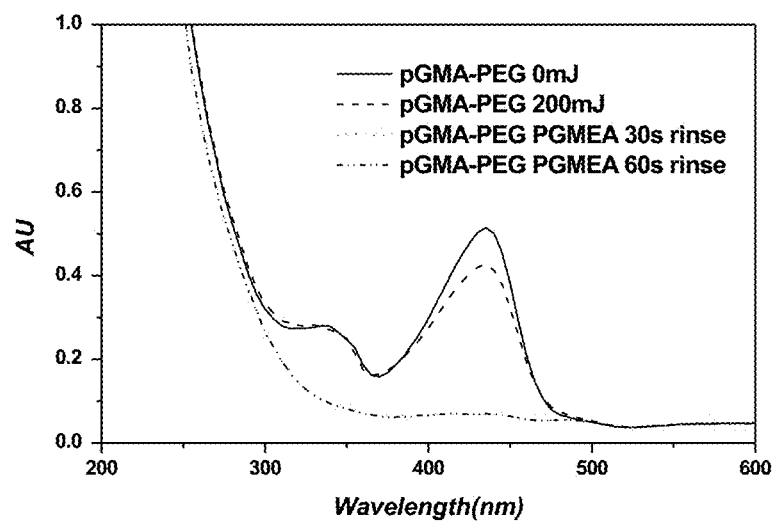
FIG. 1 compares the absorption spectra of thin films prepared from (a) a composition according to the present teachings that includes an epoxy-functionalized photopolymer, a photoacid generator, a photosensitizer, and an organic filler (PEG, $M_n$~250) formulated in propylene glycol methyl ether acetate, and (b) a comparative formulation without the organic filler, before and immediately after photocuring at 200 mJ, and after a 30 s or 60 s rinse in PGMEA post-curing.
Figure 1:
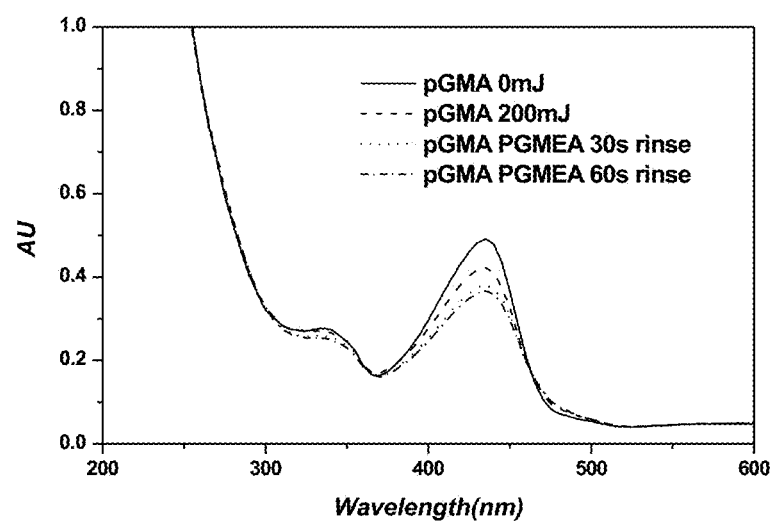

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

It should be understood that the order of steps or order for performing certain actions is immaterial so long as the present teachings remain operable. Moreover, two or more steps or actions may be conducted simultaneously.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

The present teachings relate to compositions for forming a negative-tone photopatternable dielectric material, where the compositions include, among other components, an organic filler and one or more photoactive compounds, and where the presence of the organic filler enables the effective removal of such photoactive compounds (after curing, and during or after the development step) which, if allowed to remain in the photopatterned dielectric material, would lead to deleterious effects on its dielectric properties. For example, the present compositions can be used to prepare a photopatterned component in a transistor device. Such photopatterned component can have a high degree of crosslinking (and therefore a high degree of mechanical robustness and thermal and/or chemical resistance) but a significantly reduced level of photoactive compounds compared to the mother composition. Therefore, a transistor device according to the present teachings can have better device performance and improved stability compared to a transistor device having a similarly photopatterned dielectric material that retains a considerable amount of photoactive compounds.

More particularly, the present compositions generally include one or more matrix-forming compounds, one or more photoactive compounds, and an organic filler in an organic solvent or solvent mixture. Depending on the photochemistry of the matrix-forming compounds, the photoactive compounds can be adapted to initiate, promote and/or sensitize a photochemical reaction, where the photochemical reaction results in the matrix-forming compounds forming a polymerized or crosslinked matrix that is insoluble in the mother solvent or solvent mixture. The organic filler is inert (i.e., not a reactant) in the photochemical reaction, and the solubility (or miscibility) of the organic filler in the organic solvent or solvent mixture is substantially the same both before and after the photochemical reaction. The weight ratio of the organic filler to the matrix-forming compounds can be between about 3:1 to about 1:4. Preferably, the weight ratio of the organic filler to the matrix-forming compounds is between about 1:1 to about 1:4. More preferably, the weight ratio of the organic filler to the matrix-forming compounds is between about 1:2 to about 1:4.

In some embodiments, the matrix-forming compounds can be selected from various photopolymerizable monomers and oligomers which, in the presence of a photoinitiator (and optionally a co-initiator and/or photosensitizer), can polymerize into an insoluble polymeric matrix upon irradiation. In some embodiments, the matrix-forming compounds can be selected from various oligomers or polymers functionalized with one or more photocrosslinkable groups which, in the presence of a photosensitizer and/or a photoacid generator, can be photocrosslinked into an insoluble matrix upon irradiation. As aforementioned, in applications where the presence of the photoinitiators, photoacid generators, and/or photosensitizers (as well as their photoproducts) is undesirable in the final photopatterned material, the organic filler in the present compositions can facilitate their extraction post-curing by keeping them mobile within the photocured matrix and allowing their removal during the developing step. Accordingly, the final photopatterned material can be made substantially free (e.g., <1% by weight) of photoinitiators, photoacid generators, photosensitizers, and their photoproducts. The present teachings also relate to methods for fabricating a transistor device having a component prepared from the compositions described herein and transistor devices having a photopatterned component that is substantially free of photoinitiators, photoacid generators, photosensitizers, and their photoproducts.

Organic Filler

Generally, the organic filler is an inert compound that has a relatively high solubility in or is miscible with the organic solvent or solvent mixture used in the present composition. For example, in embodiments where the matrix-forming compounds are present in the composition at 100 mg/mL, the organic filler can have a minimum solubility of 25 mg/mL. The organic filler is not reactive with any of the matrix-forming compounds, photoactive compounds, and/or organic solvents present in any given embodiment of the compositions according to the present teachings under the reaction conditions used to polymerize or crosslink the matrix-forming compounds. Generally, the organic filler is a chemically stable compound, does not absorb light within the UV-vis spectrum, and does not have functional groups (e.g., amine groups, thiol groups, (meth)acrylate groups, etc.) that readily react with the polymerizable group(s) and/or photocrosslinkable groups present in the matrix-forming compounds.

The organic filler can have a molecular weight between about 200 g/mol and about 2500 g/mol. In certain embodiments, the molecular weight of the organic filler may not be lower than the molecular weight of the highest molecular weight photoactive compounds in the composition by more than 50%. For example, if the composition includes only a photosensitizer as the photoactive compound, and the photosensitizer has a molecular weight of 400 g/mol, the organic filler can be a compound that has a molecular weight of 200 g/mol or higher. Preferably, the molecular weight of the organic filler is at least 300 g/mol, more preferably, at least 500 g/mol, and even more preferably, at least 750 g/mol; yet no greater than 2500 g/mol, preferably, no greater than 2000 g/mol, more preferably, no greater than 1500 g/mol, and even more preferably, no greater than 1000 g/mol.

In addition, the organic filler typically has a boiling point higher than 150° C. This is because after the composition is deposited onto the substrate but before irradiation, a soft-baking step is often performed to reduce solvent concentration in the film, which helps to prevent bubbling, minimize dark erosion, and improve film adhesion to the substrate. Soft-baking step often is performed at around 100° C. Preferably, the boiling point of the organic filler is between about 200° C. and about 700° C.

In preferred embodiments, the organic filler either is miscible with or has a solubility of at least 25 mg/mL in common photoresist solvents including ester solvents such as ethyl lactate (EL), ethyl 3-ethoxy propionate (EEP), propylene glycol methyl ether acetate (PGMEA); and ketone solvents such as 2-heptanone (or methyl n-amyl ketone, MAK). As used herein, "miscible" means that the organic filler and the organic solvent or solvent mixture do not exhibit phase separation. In more preferred embodiments, the organic filler is miscible with or has a solubility of at least 25 mg/mL in an organic solvent or solvent mixture comprising an ester solvent. In most preferred embodiments, the organic filler is miscible with or has a solubility of at least 25 mg/mL in an organic solvent or solvent mixture comprising propylene glycol methyl ether acetate.

The organic filler generally can be present at about 5-30 wt % in the composition, and have a weight ratio to the matrix-forming compounds between about 3:1 and about 1:4. In embodiments where the organic filler is a liquid at room temperature, the organic filler can be distinguished from the organic solvent by at least one of the following: 1) the matrix-forming compounds have a solubility of less than 50 mg/mL in the organic filler and/or the photoactive compounds have a solubility of less than 5 mg/mL in the organic filler, 2) the organic solvent (which typically has a boiling point between about 140° C.-180° C.) has a significantly lower boiling point than the organic filler (which is typically between about 200° C. and about 700° C.), and 3) the organic solvent is present in the initial composition at a much higher wt % than the organic filler (about 50-85 wt % for the organic solvent versus 5-30 wt % for the organic filler). Further, the organic filler is adapted to be present in the thin film until the developing step, while the organic solvent is mostly driven off (e.g., via the soft-baking step) prior to the photoexposure step and only a small amount of it is adapted to remain in the thin film during photocuring.

In some embodiments, and particularly in embodiments where the matrix-forming compounds comprise (meth)acrylate-based monomers, oligomers, and/or polymers, the organic filler can be selected from methoxylated or ethoxylated poly(alkylene oxide)s and their fluorinated derivatives. Specific examples include polyethylene glycol dimethyl ether, and oligomers of hexapropylene oxide. In preferred embodiments, the matrix-forming compounds are polyethylene glycol dimethyl ether having a number average molecular weight ($M_n$) of 200 g/mol, 250 g/mol, 300 g/mol, 400 g/mol, or 500 g/mol.

In some embodiments, the organic filler can be a compound having a cyclic ring at one end and a long lipophilic chain at the other. For example, the lipophilic chain can have at least 8 carbon atoms. Examples include (±)-α-tocopherol, DL-α-tocopherol acetate, retinyl acetate, and retinyl palmitate.

Matrix-Forming Compounds

The present compositions can include one or more matrix-forming compounds. In various embodiments, the matrix-forming compounds can be present at about 5-30 wt % in the composition. In some embodiments, the matrix-forming compound can be an oligomer or polymer functionalized with a photocrosslinkable group. For example, the photocrosslinkable group can be a functional group that includes a double bond, a triple bond, a heterocyclic addition-polymerizable group, or a precursor capable of in-situ formation of a double or triple bond or a heterocyclic addition-polymerizable radical. In certain embodiments, the photocrosslinkable group can comprise a vinyl moiety, an allyl moiety, an ethynyl moiety, a dienyl moiety, an acrylate moiety, a cinnamate moiety, a coumarinyl moiety, a benzocyclobutane moiety, an epoxy or oxirane moiety (e.g., an epoxycyclohexyl ethyl group, a glycidyl group, a glycidyl ether group, a propyl glycidyl ether group), an oxetane moiety, or a thiirane moiety.

To illustrate, the matrix-forming compound can be a polymer having a photocrosslinkable group selected from the group consisting of:

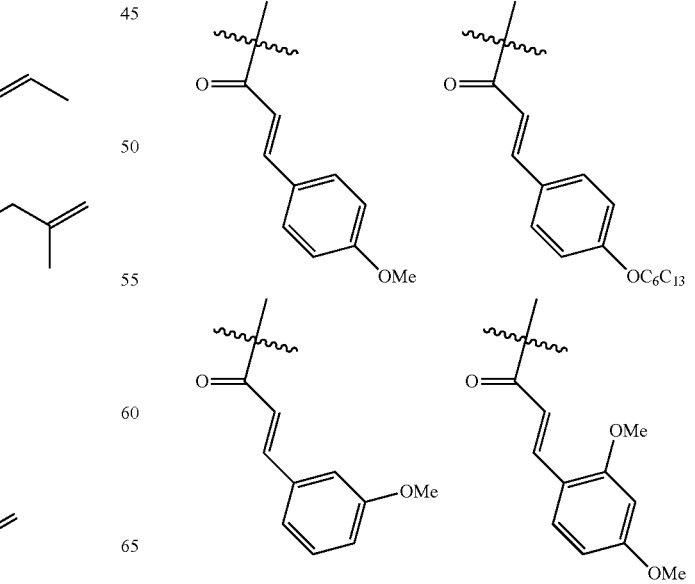

-continued

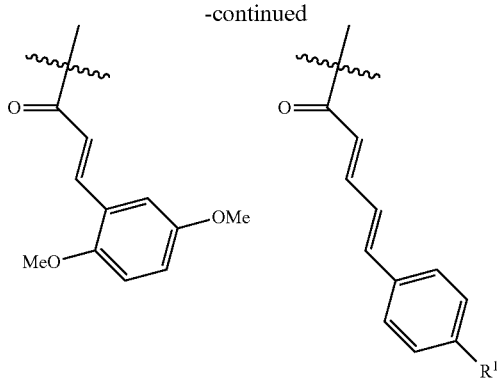
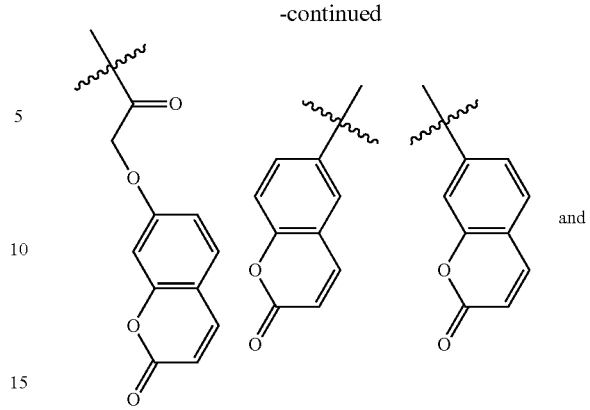
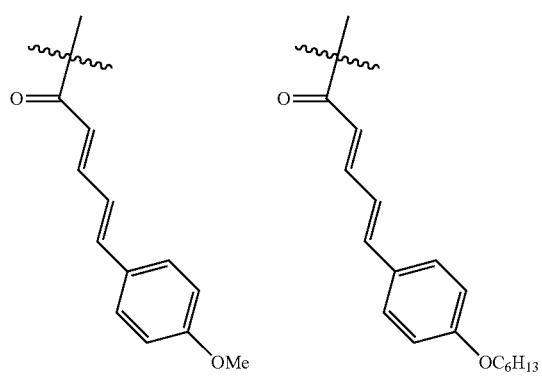
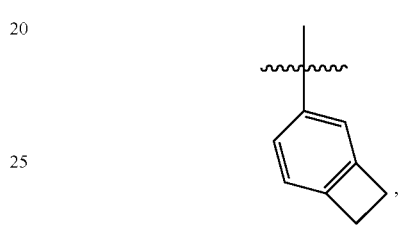
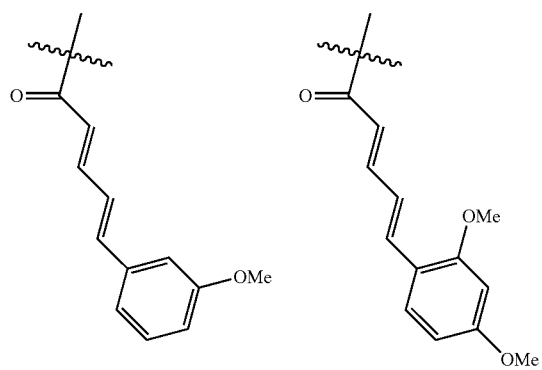
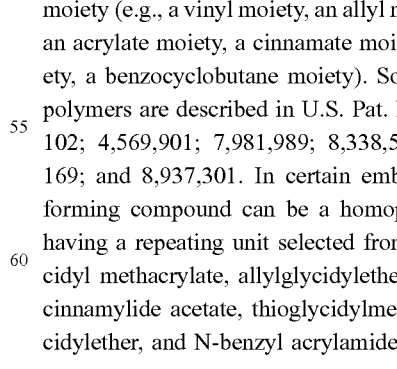
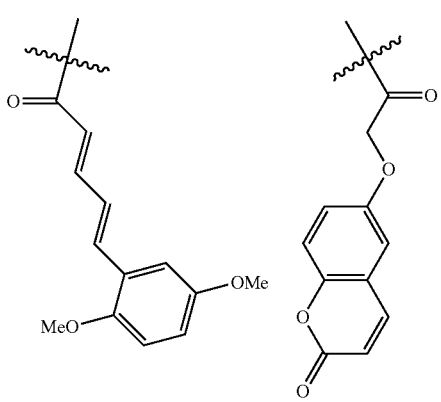

wherein $R^1$ is H or a $C_{1-20}$ alkyl group.

These photocrosslinkable groups can be attached as pendant groups to various polymer backbones. Suitable polymer backbones include various dielectric polymers, examples of which include, but are not limited to, poly(vinyl phenol), poly(vinyl acetate), poly(vinyl alcohol), poly(acrylate), poly(methacrylate), poly(methyl methacrylate), polystyrene, poly(ethylene amine), polymaleimide, polyimide, polysulfone, siloxane polymer, phenol formaldehyde (Novolac) resin, a benzoxazole polymer, poly(oxadiazole), maleic anhydride polymer, and copolymers thereof.

Accordingly, in some embodiments, the matrix-forming compound can be a vinyl (co)polymer (e.g., poly(vinyl phenol), poly(vinyl acetate), poly(vinyl alcohol), poly(acrylate), poly(methacrylate), poly(methyl methacrylate), polystyrene, poly(ethylene amine)) with pendant groups functionalized with an ethylenically unsaturated bond-containing moiety (e.g., a vinyl moiety, an allyl moiety, a dienyl moiety, an acrylate moiety, a cinnamate moiety, a coumarinyl moiety, a benzocyclobutane moiety). Some examples of these polymers are described in U.S. Pat. Nos. 2,670,287; 2,716,102; 4,569,901; 7,981,989; 8,338,555; 8,802,783; 8,878,169; and 8,937,301. In certain embodiments, the matrix-forming compound can be a homopolymer or copolymer having a repeating unit selected from vinylcinnamate, glycidyl methacrylate, allylglycidylether, ethyl acrylate, vinyl cinnamylide acetate, thioglycidylmethacrylate, allythioglycidylether, and N-benzyl acrylamide.

For example, the matrix-forming compound can be a polymer having a (co-)repeating unit selected from the group consisting of:

11
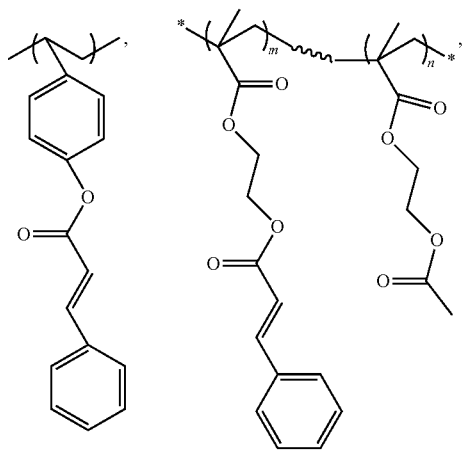
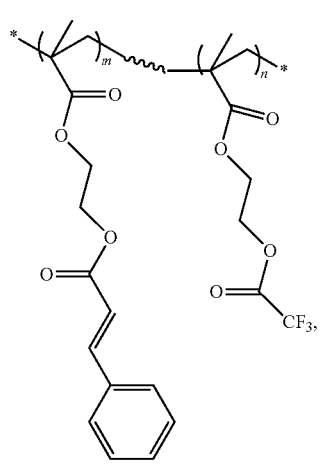
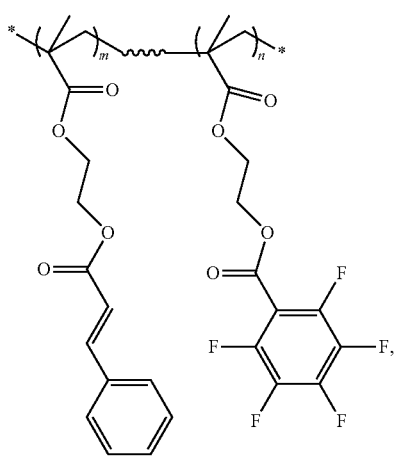
12
-continued
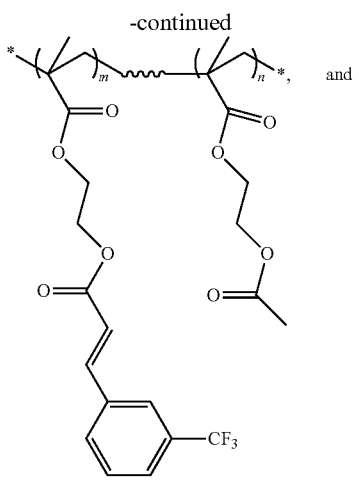
where $R^1$ and $R^2$ can be selected from the group consisting of H, F and CN, and m and n are real numbers where $m>0$ and $n>0$;
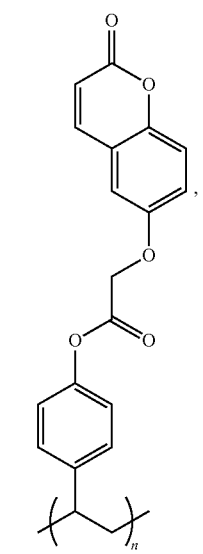

-continued

13

14

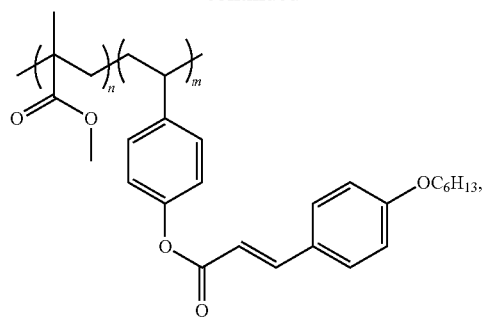
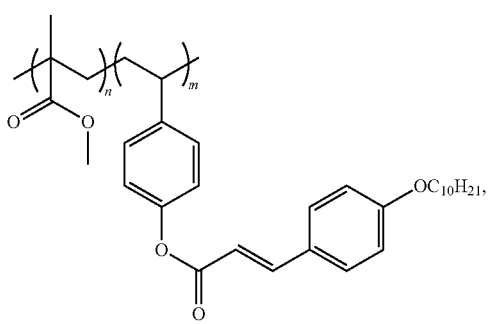
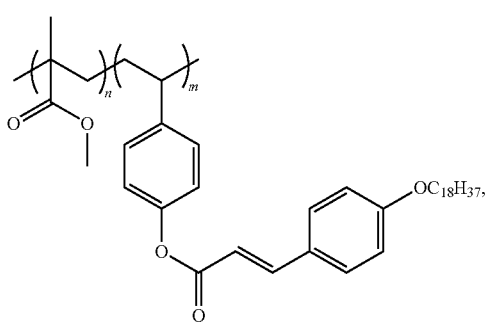
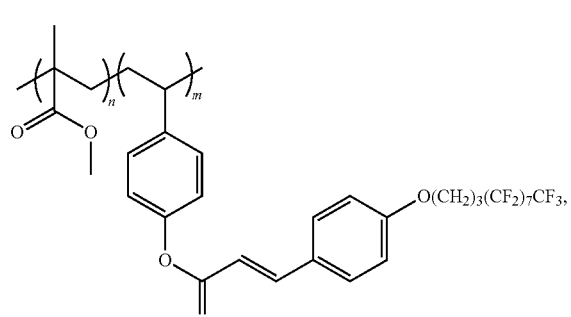
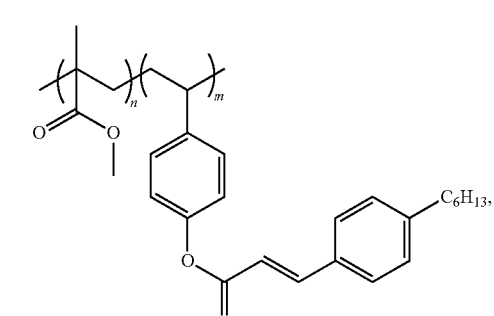
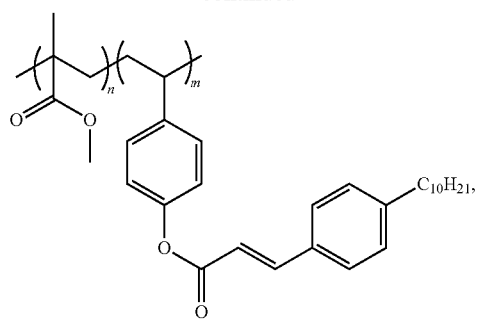
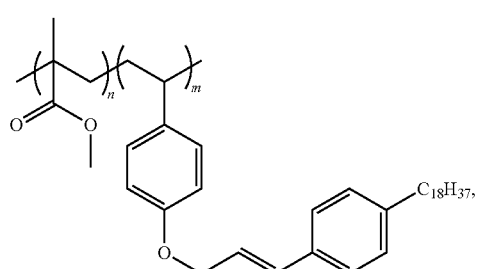
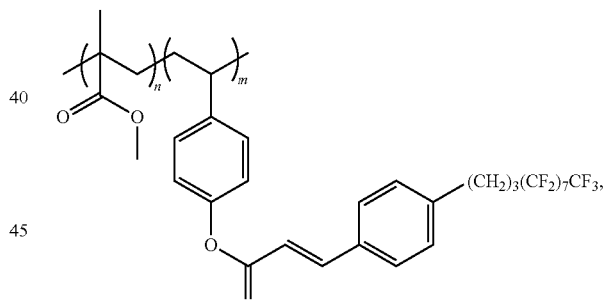
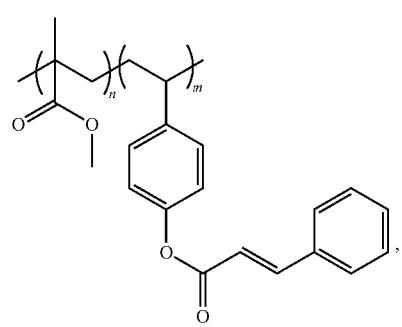

17
-continued
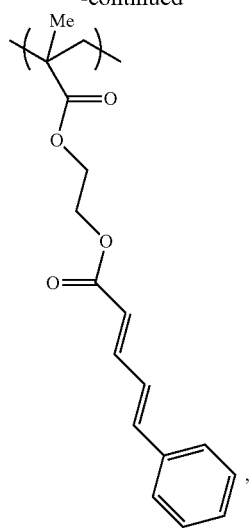
,
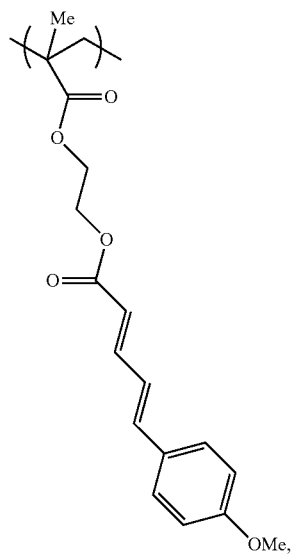
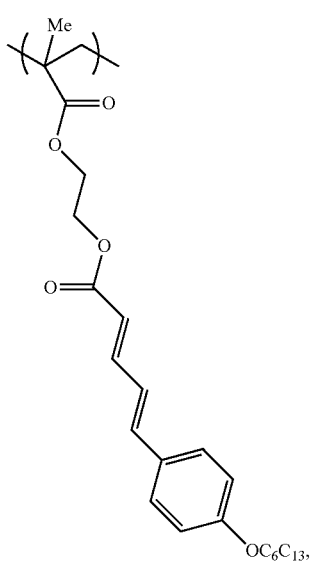
18
-continued
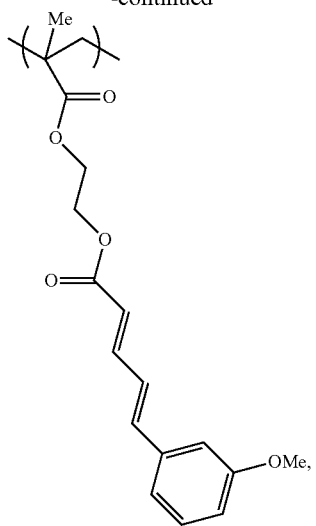
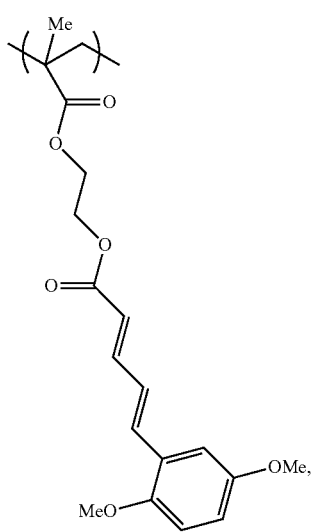

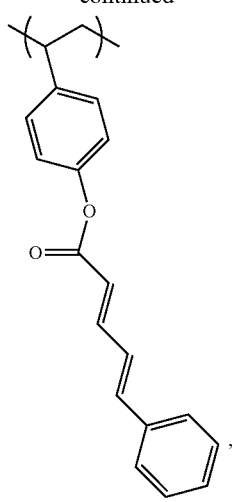
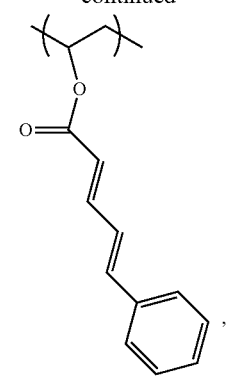
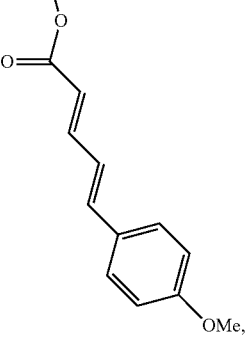
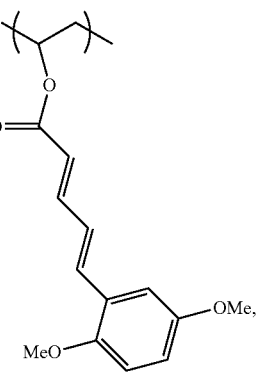
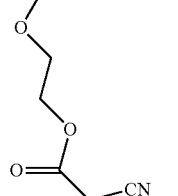
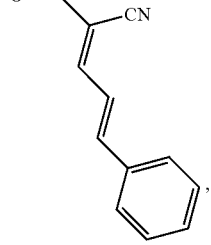

-continued
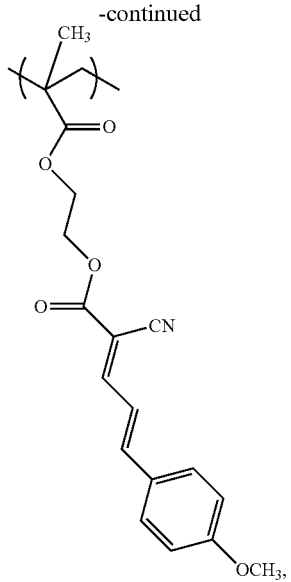
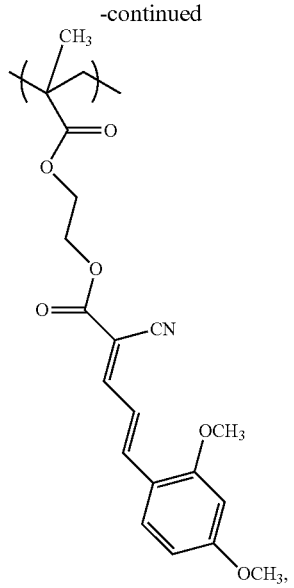
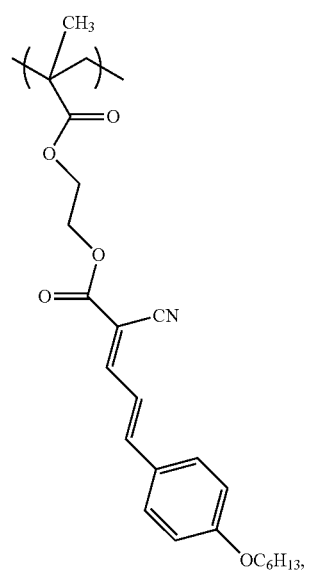
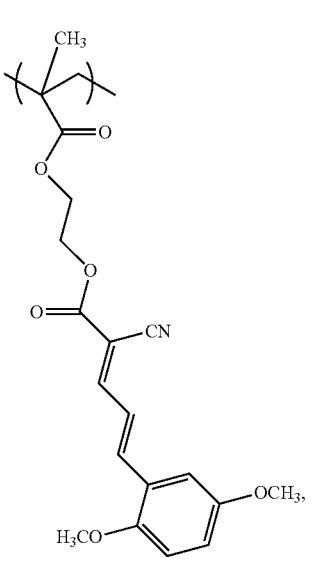
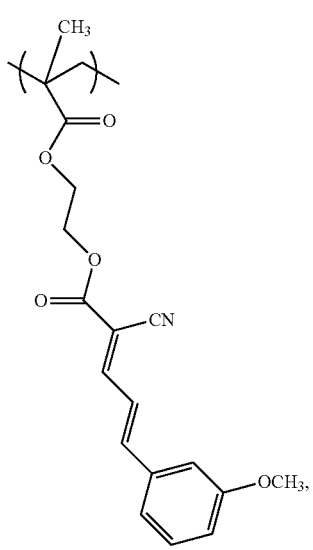

23
-continued
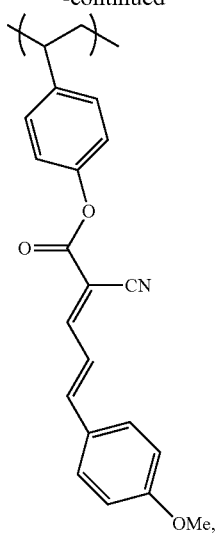
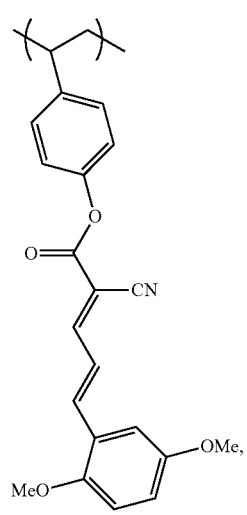
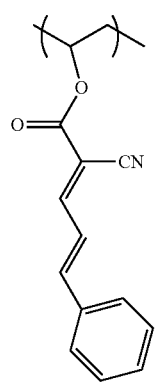
24
-continued
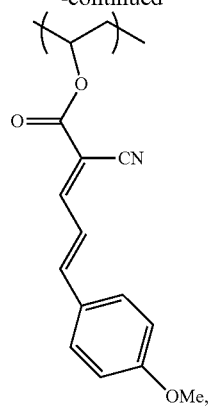
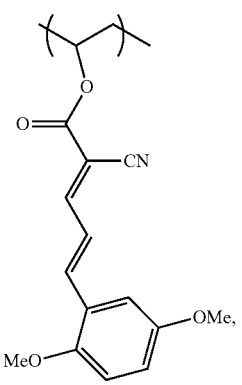
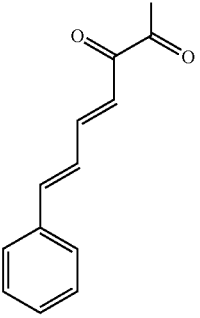

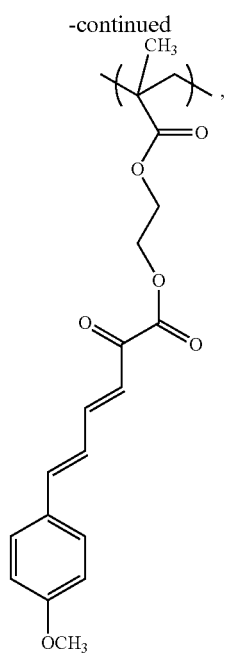
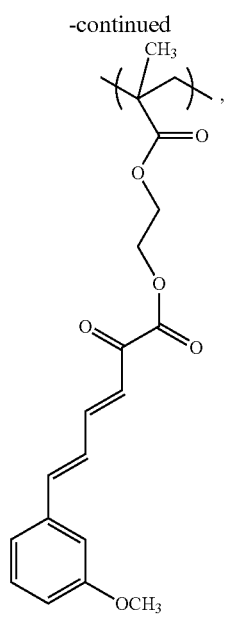
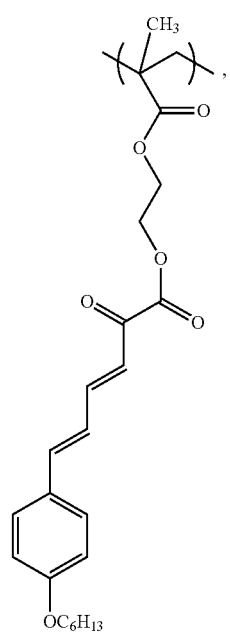
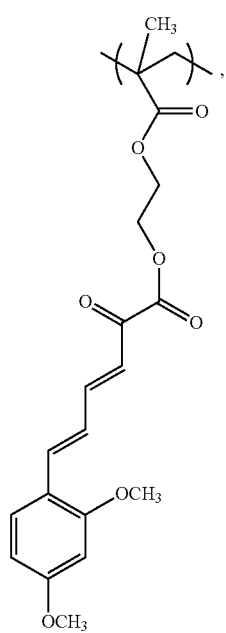

27
-continued
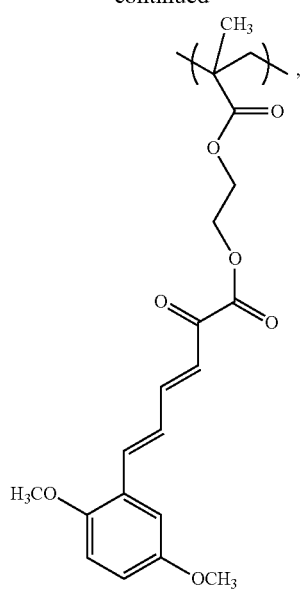
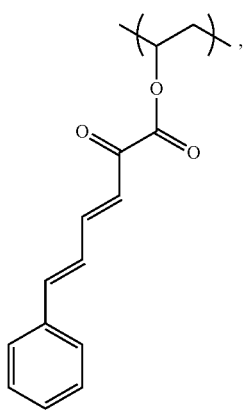
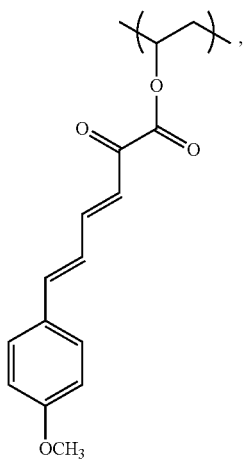
28
-continued
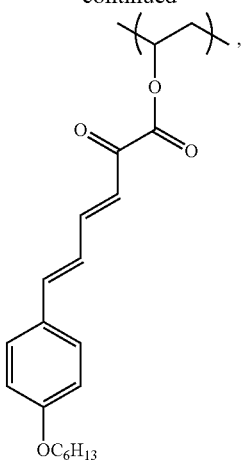
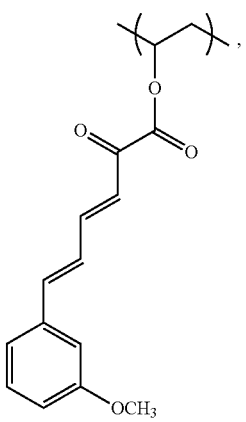
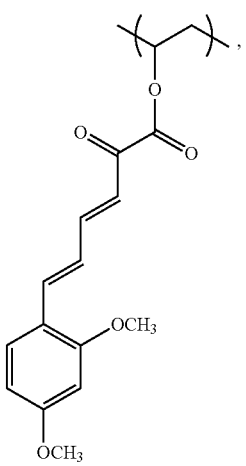

29
-continued
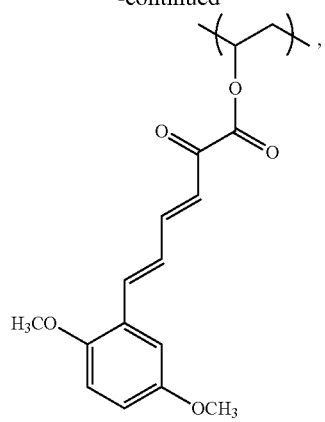
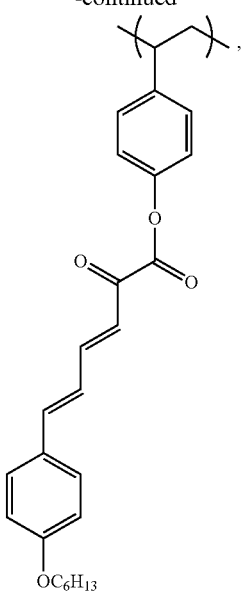
30
-continued
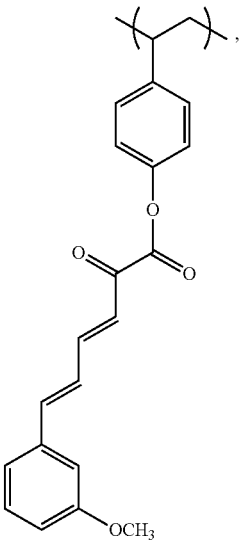
, and
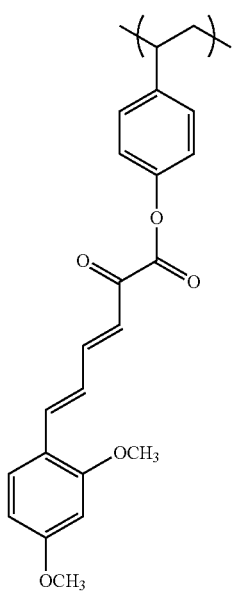

-continued

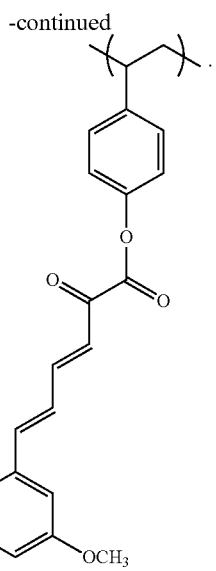

In some embodiments, the matrix-forming compound can be a polyimide, polymaleimide, polysulfone, siloxane polymer, phenol formaldehyde (Novolac) resin, benzoxazole polymer, poly(oxadiazole), maleic anhydride polymer, or a copolymer thereof, with pendant groups functionalized with an ethylenically unsaturated bond-containing moiety (e.g., a vinyl moiety, an allyl moiety, a dienyl moiety, an acrylate moiety, a cinnamate moiety, a coumarinyl moiety, a benzocyclobutane moiety), an epoxy or oxirane moiety (e.g., an epoxycyclohexyl ethyl group, a glycidyl group, a glycidyl ether group, a propyl glycidyl ether group), an oxetane moiety, or a thiirane moiety. Some examples of these polymers are described in U.S. Pat. Nos. 4,180,404 and 9,035,287; and U.S. Pat. Pub. No. 2015/0021597.

For example, the matrix-forming compound can be a polymer having a (co-)repeating unit selected from the group consisting of:

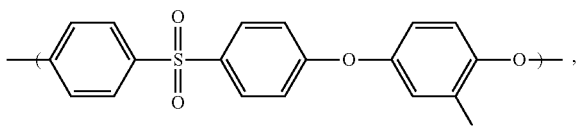

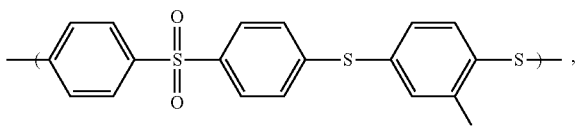

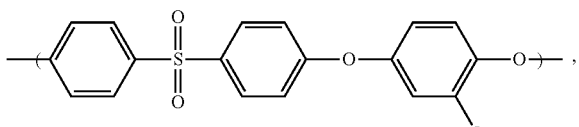

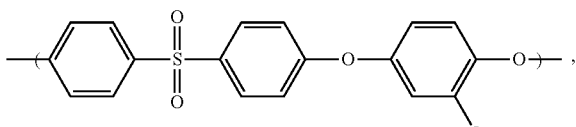

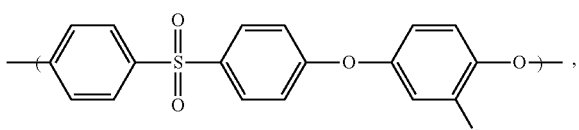

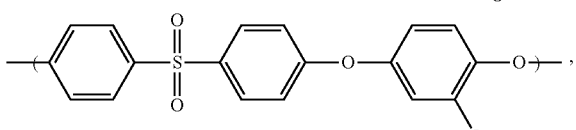

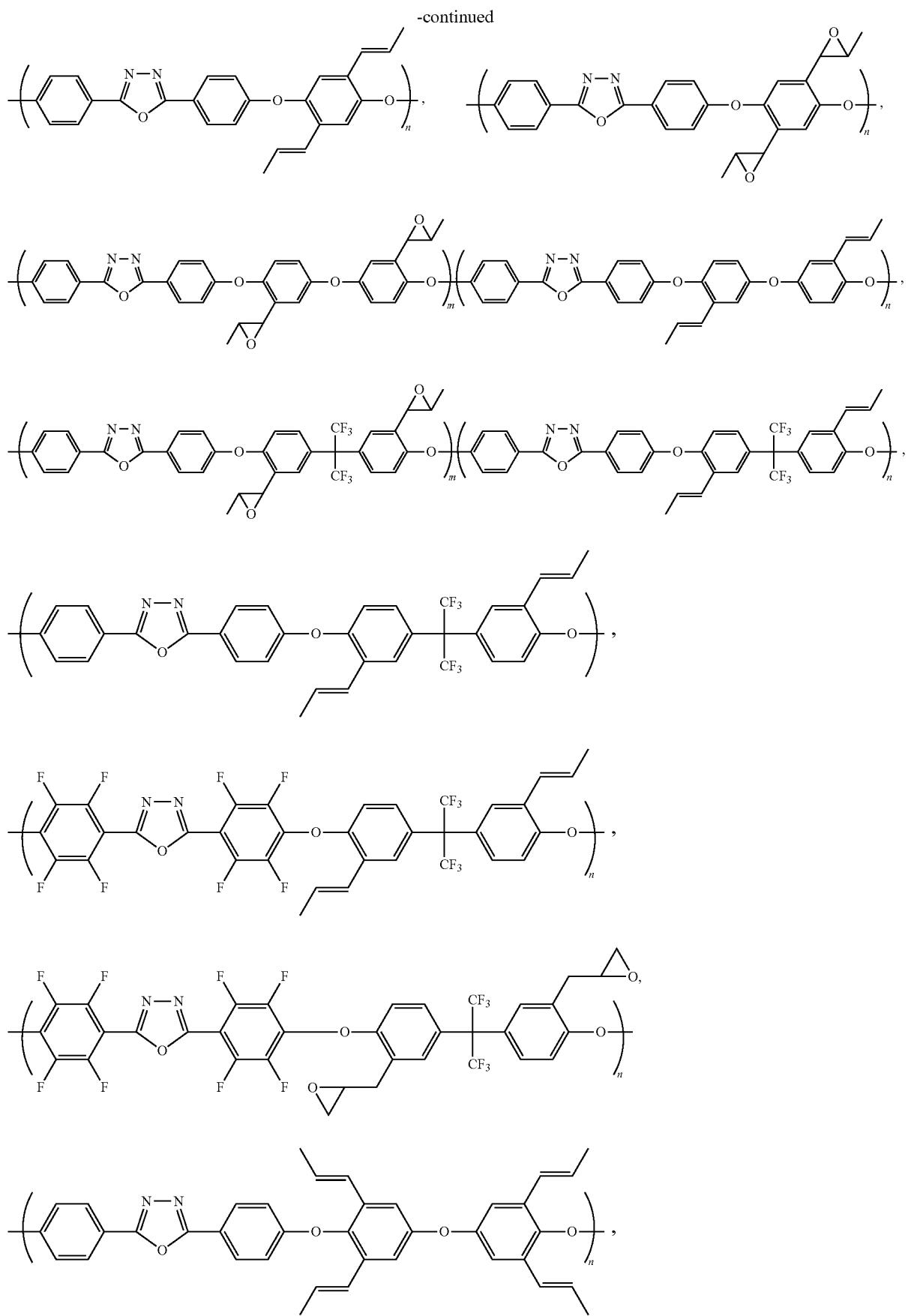

-continued

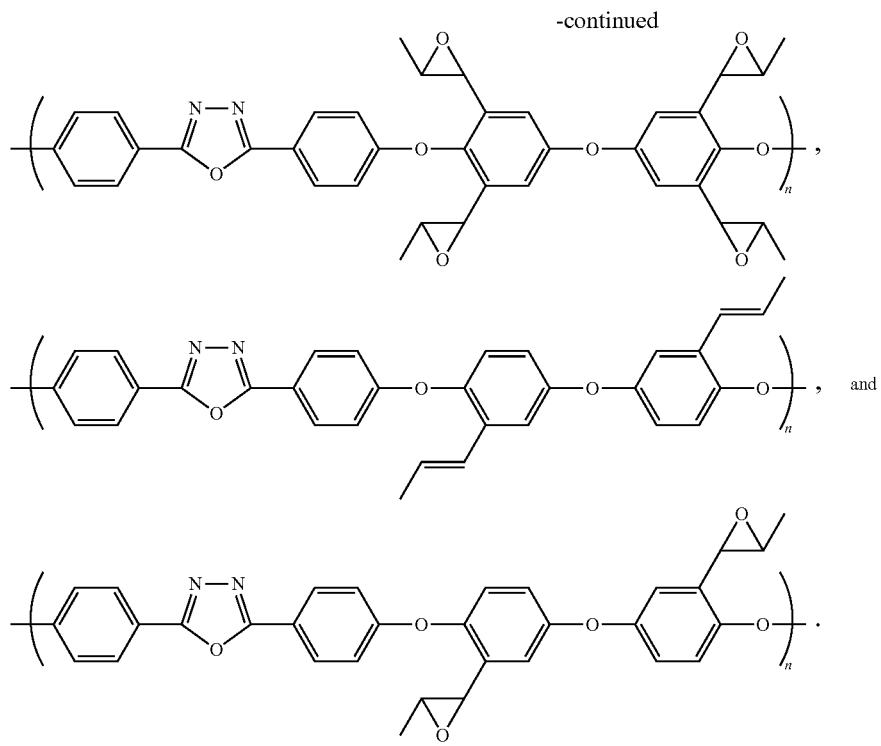

In embodiments where the matrix-forming compound is a dielectric polymer functionalized with inherently photoreactive groups (e.g., groups such as cinnamate that can be photo-stimulated to undergo cycloaddition), the present composition can include a photosensitizer as the only photoactive compound. However, photoinitiators such as photoacid generators, free radical initiators also may be added depending on the photochemistry. In embodiments where the matrix-forming compound is a dielectric polymer functionalized with a photopolymerizable groups, the present composition can include at least a photoinitiator (e.g., a photoacid generator) and optionally a photosensitizer. See e.g., Nakamura, Kenichiro; Photopolymers: Photoresist Materials, Processes, and Applications; CRC Press; $1^{st}$ ed. (2014).

In other embodiments, the matrix-forming compounds can include one or more photopolymerizable monomers and/or oligomers. Suitable photopolymerizable monomers and oligomers include, but are not limited to, (i) monofunctional and/or polyfunctional acrylate monomers and oligomers, (ii) monofunctional and/or polyfunctional epoxy or epithio monomers and oligomers, (iii) monomeric styrene and oligomeric acrylates, (iv) thiol-ene monomers and oligomers, (v) acrylate- and/or epoxy-functionalized polyhedral oligomeric silsesquioxanes, (vi) monofunctional and/or polyfunctional maleimide monomers and oligomers, and (vii) mixtures thereof.

Examples of monofunctional and/or polyfunctional acrylate monomers and oligomers include isoamyl acrylate, stearyl acrylate, lauryl acrylate, octyl acrylate, decyl acrylate, isoamylstyl acrylate, isostearyl acrylate, 2-ethylhexyl-diglycol acrylate, 2-hydroxybutyl acrylate, 2-acryloyloxyethylhexahydrophthalic acid, butoxyethyl acrylate, ethoxydiethylene glycol acrylate, methoxydiethylene glycol acrylate, methoxypolyethylene glycol acrylate, methoxypropylene glycol acrylate, phenoxyethyl acrylate, tetrahydrofurfuryl acrylate, isobornyl acrylate, 2-hydroxyethyl acrylate, 2-hydroxypropyl acrylate, 2-hydroxy-3-phenoxypropyl acrylate, vinyl ether acrylate, 2-acryloyloxyethylsuccinic acid, 2-acryloxyethylphthalic acid, 2-acryloxyethyl-2-hydroxyethyl-phthalic acid, lactone modified flexible acrylate, and t-butylcyclohexyl acrylate, triethylene glycol diacrylate, tetraethylene glycol diacrylate, polyethylene glycol diacrylate, dipropylene glycol diacrylate, tripropylene glycol diacrylate, polypropylene glycol diacrylate, 1,4-butanediol diacrylate, 1,6-hexanediol diacrylate, 1,9-nonanediol diacrylate, neopentyl glycol diacrylate, dimethylol-tricyclodecane diacrylate, bisphenol A EO (ethylene oxide) adduct diacrylate, bisphenol A PO (propylene oxide) adduct diacrylate, hydroxypivalate neopentyl glycol diacrylate, propoxylated neopentyl glycol diacrylate, alkoxylated dimethyloltricyclodecane diacrylate and polytetramethylene glycol diacrylate, trimethylolpropane triacrylate, EO modified trimethylolpropane triacrylate, tri(propylene glycol)triacrylate, caprolactone modified trimethylolpropane triacrylate, pentaerythritol triacrylate, pentaerithritol tetraacrylate, pentaerythritolethoxy tetraacrylate, dipentaerythritol hexaacrylate, ditrimethylolpropane tetraacrylate, glycerinpropoxy triacrylate, and caprolactam modified dipentaerythritol hexaacrylate.

Other suitable monofunctional acrylates include caprolactone acrylate, cyclic trimethylolpropane formal acrylate, ethoxylated nonyl phenol acrylate, isodecyl acrylate, isooctyl acrylate, octyldecyl acrylate, alkoxylated phenol acrylate, tridecyl acrylate and alkoxylated cyclohexanone dimethanol diacrylate.

Other suitable difunctional acrylates include alkoxylated cyclohexanone dimethanol diacrylate, alkoxylated hexanediol diacrylate, dioxane glycol diacrylate, dioxane glycol diacrylate, cyclohexanone dimethanol diacrylate, diethylene glycol diacrylate and neopentyl glycol diacrylate.

Other suitable trifunctional acrylates include propoxylated glycerine triacrylate and propoxylated trimethylolpropane triacrylate.

Other higher functional acrylates include di-trimethylolpropane tetraacrylate, dipentaerythritol pentaacrylate, ethoxylated pentaerythritol tetraacrylate, methoxylated glycol acrylates and acrylate esters.

Furthermore, methacrylates corresponding to the above-mentioned acrylates may be used such as methoxytriethylene glycol methacrylate, hydroxyethyl methacrylate, phenoxyethyl methacrylate, cyclohexyl methacrylate, and tetraethylene glycol dimethacrylate.

Examples of monofunctional and/or polyfunctional epoxy or epithio monomers and oligomers include, but are not limited to, trimethylolpropane triglycidyl ether isocyanurate tris(4-hydroxyphenyl)methane triglycidyl ether tris(2,3-epoxypropyl)

1,4-cyclohexanedimethanol diglycidyl ether 1,4-butanediol diglycidyl ether bis(beta-epithiopropyl)sulfide bis(beta-epithiopropyl)sulfide bisphenol A diglycidyl ether 3,4-epoxycyclohexylmethyl 3,4-epoxycyclohexanecaboxylate divinylbenzene dioxide bis[2-(3,4-epoxycylohexyl)ethyl]tetramethyl disiloxane and

SU8

Examples of monomeric styrene and oligomeric acrylate systems include, but are not limited to, N,N-dimethylaminomethyl methacrylate (DMAEMA), 2-hydroxyethyl acrylate (HEA), 2-ethylhexyl acrylate (EHA), and styrene; tertiary-butyl acrylate, tertiary-butyl methacrylate, di-tertiary-butyl itaconate, tertiary-butyl hydroxymethylacrylate, cyclohexyl methyl (meth)acrylate, cyclohexyl ethyl (meth)acrylate, phenethyl (meth)acrylate, benzyl (meth)acrylate, isobornyl (meth)acrylate and tetrahydrofurfural (meth)acrylate, and hydroxy styrene and α-methyl hydroxy styrene.

Thiol-ene reactions involve the addition of a S—H bond across a double or triple bond by either a free radical or ionic mechanism. Therefore, thiol-ene monomers generally include a mixture of polythiols and a second compound having an ethylenically unsaturated bond. Examples of polythiols include di-, tri- and tetra-thiols such as hexanedithiol, decanedithiol, 1,4-butanediolbisthiopropionate, 1,4- butanediol bisthioglycolate, ethylene glycol bisthioglycolate, 4-mercaptomethyl-3,6-dithia-1,8-octanedithiol; trimethylolpropane tris(3-mercaptopropionate); pentaerythritol tetrakis(3-mercaptoacetate); trimethylolpropane tris(3-mercaptoacetate); pentaerythritol tetrakis(3-mercapto-propionate); ethoxylated pentaerythritol tetrakis(3-mercaptopropionate), glycol 3-mercaptopropionate, polypropylene glycol (3-mercaptopropionate), ethoxylated trimethylpropane tris(3-mercaptopropionate), ethoxylated glycol dimercaptoacetate, trimethylolpropane trimercaptoacetate, glycol di(3-mercaptopropionate), 1,4-bis(3-mercaptobutylyloxy)butane, pentaerythritol tetrakis(3-mercaptobutyrate), tris[2-(3-mercaptopropionyloxy)ethyl] isocyanurate, 1,3,5-tris(3-mercaptobutyloxyethyl)-1,3,5-triazine-2,4,6(1H,3H,5H)-trione, and (mercaptopropyl)methylsiloxane-dimethylsiloxane copolymers.

Polyhedral oligomeric silsesquioxanes are cage-structured silsesquoixanes having the basic composition of $(RSiO_{1.5})_n$, where the R groups are attached to the silicon atoms at the vertices of the cage. Suitable polyhedral oligomeric silsesquioxanes for the present photocurable compositions can have a $T_8$, $T_{10}$, or $T_{12}$ structure (n=8, 10, or 12, respectively) as shown below:

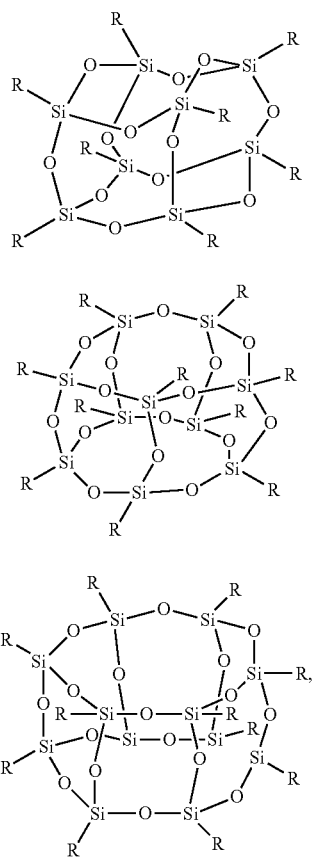

where each R, independently, can be an epoxy group, an acrylate group, or a methacrylate group.

Examples of monofunctional and/or polyfunctional maleimide monomers and oligomers include N-functionalized maleimides and bismaleimides. Exemplary N-functionalized maleimides and bismaleimides can be represented by the formulae:

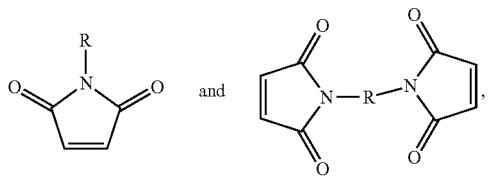

respectively, where R can be an aryl, heteroaryl, or aliphatic group. Monofunctional and/or polyfunctional maleimide monomers and oligomers can be photopolymerized (optionally with other monomers such as vinyl monomers) into polyimides such as those described in U.S. Pat. Nos. 4,310,641, 4,578,328, and 8,415,812, and International Publication No. WO2014/081894.

For the above embodiments where the matrix-forming compounds include one or more photopolymerizable monomers and/or oligomers, the present composition generally includes at least one photoinitiator as the photoactive compound. Depending on the actual photochemistry and the reaction conditions, a co-initiator may be required. For example, a co-initiator which acts as an oxygen scavenger may be required if the photopolymerization is carried out in air (instead of a nitrogen atmosphere). In addition, photosensitizers may be used to excite the photoinitiator(s).

Photoinitiators, Photoacid Generators, and Photosensitizers

Photochemical reactions occur when a reactive species is produced upon irradiation of a compound. In the simplest scenario, if the compound (in this case, the matrix-forming compound) does not absorb the incident irradiation wavelength, or does not form a reactive intermediate upon irradiation, a second compound (in this case, the "photoactive compound") can be added that absorbs the incident wavelength strongly and either undergoes a photochemical transformation into one or more reactive species or transfers energy (or an electron) to the matrix-forming compound. The matrix-forming compound then either interacts with the reactive species or the matrix-forming compound reacts chemically and becomes crosslinked or polymerized to provide the desired product (in this case, the insoluble matrix). In more complicated systems, a combination of different photoactive compounds may be needed and the reaction mixture also may include a combination of different matrix-forming compounds. Depending on the matrix-forming compound(s) in a particular embodiment, the present composition can include one or more photoinitiators, photoacid generators and/or photosensitizers. Because the terms photoinitiators, photoacid generators, and photosensitizers are functional labels, and a particular compound may perform different functions for different reaction mixtures under different reaction conditions, it is possible for the same compound to function as a photoinitiator in one reaction but as a photosensitizer in a different reaction.

In embodiments where the matrix-forming compound is a photopolymerizable monomer or oligomer, a photoinitiator system comprising at least one photoinitiator is required to initiate the photopolymerization reaction. Upon irradiation, the photoinitiators decompose into reactive species that activate polymerization of specific functional groups on the monomers and/or oligomers. In certain embodiments, one or more photosensitizers (e.g., choromophores that absorb in a much longer wavelength region than the photoinitiators) are used in conjunction with the photoinitiators. The photosensitizers can help shorten curing time and/or lower the required radiation dosage by exciting the photoinitiators through an energy transfer.

Different photoinitiator systems are known in the art and can be divided roughly into three groups based on the generated active species. Specifically, photoinitiators are compounds that can convert absorbed electromagnetic energy (i.e., upon exposure of visible light, ultraviolet light, far ultraviolet light, electron beam and X-ray) into chemical energy in the form of initiating reactive species, specifically, free radicals, cation or anion active sites. Typically, the photoinitiator is activated by incident light having a wavelength between about 200 nanometers and about 500 nanometers. In certain embodiments, the photoinitiator is activated by light having a wavelength between about 250 nm and about 450 nm.

Free radical photoinitiators typically are used in the photopolymerization of vinyl monomers and oligomers, although they also can be useful in the photocrosslinking of oligomers or polymers with ethylenically unsaturated groups. Some free radical photoinitiators are one-component systems where two radicals are generated by cleavage, others work in a two-component system where the radical is generated through abstraction of a hydrogen atom from a donor compound (a co-initiator, which also acts as oxygen scavengers that can suppress oxygen inhibition of free radical polymerization). The resulting free radical then reacts with other monomer, oligomer, or polymer molecules to form additional free radicals, while at the same time building or crosslinking the resulting polymer. The overall result is a chain reaction whereby successive free radical species react with monomers and oligomers to form a polymer, which terminates when two free radical species react. The same sequence of reactions occur in the crosslinking of a polymer and the reactions terminate when the reactive portion of the polymer encounters some other chain terminating group. Benzoin ethers, acetophenones, benzoyl oximes, and acylphosphine oxides are some examples of cleavage-type (Type I) photoinitiators. Benzophenone, xanthones, and quinones are examples of abstraction-type (Type II) photoinitiators. Examples of co-initiators include tertiary aliphatic amines such as diethanol amine and triethylamine; aromatic amines such as dialkylanilines; and amine acrylates such as ethyl-4-dimethylaminobenzoate. Thiols and silanes also may be used as co-initiators.

Specific examples of free radical photoinitiators include benzoin ethers such as benzoin methyl ether, benzoin isopropyl ether, benzoin isobutyl ether, benzoin ethyl ether, and the like; benzil ketals such as benzildimethyl ketal and the like; α-dialkoxy-acetophenone/α-hydroxy-alkylphenones/α-amino-alkylphenones such as 2,2-dimethoxy-2-acetophenone [Irgacure 651 (IR651), commercially available from BASF], 2-hydroxy-2-methyl-1-phenylpropan-1-one, 1-(4-isopropylphenyl)-2-hydroxy-2-methylpropan-1-one, 4-(2-hydroxyethoxy)phenyl-(2-hydroxy-2-propyl)ketone, 2,2-dimethoxyacetophenone, 2,2-diethoxyacetophenone, 2-benzyl-2-dimethylamino-1-(4-morpholinylphenyl)butan-1-one, 2,2'-dimethoxy-1,2-diphenylethan-1-one, 4-azido-acetophenone, 4-azido-benzylidene acetophenone, and the like; benzoyl oximes such as 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone and the like; acylphosphine oxides such as triphenylphosphine oxide (TPO, commercially available from BASF), di(2,4,6-trimethyl-benzoyl)phenylphosphine oxide [Irgacure 819, (IR819), commercially available from BASF]; alkylphenyl ketones such as 1-hydroxycyclohexylphenyl ketone [Irgacure 184, (IR184), commercially available from BASF], 2-methyl-(4-methylthienyl)-2-morpholinyl-1-propan-1-one [Irgacure 907(IR907), commercially available from BASF], and the like; benzophenone-based photoinitiators such as benzophenone, 4,4'-di(dimethylamino)benzophenone, 4,4'-di(diethylamino)-benzophenone, 3,3'-dimethyl-4-methoxy benzophenone, 4,4'-dichlorobenzophenone, and the like; thioxanthones such as 1-chloro-4-propoxy-9H-thioxanthen-9-one, 2,4'-diethylthioxanthen-9-one, 2-chlorothioxanthen-9-one, isopropyl-9H-thioxanthen-9-one, 10-methylphenothiazine, thioxanthe-9-one, and the like; and quinones such as 2-tert-butyl anthraquinone, 1-chloroanthraquinone, 2-ethylanthraquinone, 2-amylanthraquinone, and the like. Additional free radical initiators include coumarin and ketocoumarin derivatives, pyrylium and thiopyrylium salts, and some 1,2-diketones. Examples of aliphatic amines that can be used as co-initiators together with Type II photoinitiators include tertiary amines such as N-methyldiethanolamine, triethanolamine, 2-(dimethylamino)ethyl acrylate, and the like.

Cationic photoinitiators can be used to initiate the cationic polymerization of olefins with electron-donating substituents (e.g., methoxyethene, 4-methoxystyrene, styrene) and heterocyclic monomers (cyclic ethers, cyclic esters, cyclic amides, and cyclic amines). In a cationic polymerization, a cationic photoinitiator transfers charge to a monomer which then becomes reactive. This reactive monomer goes on to react similarly with other monomers to form a polymer via chain growth. Cationic photoinitiators that generate photoacids (i.e., photoacid generators) can be used to catalyze the deprotection of acid-sensitive organic functional groups on polymers. For example, both ionic and non-ionic photoacid generators can be used with polymers containing epoxides, oxetanes, and vinyl ethers to initiate a photoacid-catalyzed ring-opening reaction, which then can lead to crosslinking. Examples of cationic photoinitiators include onium salts and trichloromethyl-s-triazines.

In some embodiments, the cationic photoinitiators can be an onium salt of a Lewis acid or an onium salt of a Bronsted acid. Onium salts include iodonium salts, sulfonium salts, phosphonium salts ammonium salts, and diazonium salts. Specific examples can include diaryl iodonium salts such as diphenyliodonium tetrafluoroborate, diphenyliodonium tetrafluorophosphate, diphenyliodonium tetrafluoroarsenate, diphenyliodonium trifluoromethanesulfonate, diphenyliodonium trifluoroacetate, diphenyliodonium-p-toluenesulfonate, 4-methoxyphenylphenyliodonium tetrafluoroborate, 4-methoxyphenylphenyliodonium hexafluorophosphonate, 4-methoxyphenylphenyliodonium hexafluoroarsenate, 4-methoxyphenylphenyliodonium trifluoromethanesulfonate, 4-methoxyphenylphenyliodonium trifluoroacetate, 4-methoxyphenylphenyliodonium-p-toluenesulfonate, bis(4-tert-butylphenyl)iodonium tetrafluoroborate, bis(4-tert-butylphenyl)iodonium hexafluoroarsenate, bis(4-tert-butylphenyl)iodonium trifluoromethanesulfonate, bis(4-tert-butylphenyl)iodonium trifluoroacetate, bis(4-tert-butylphenyl)iodonium-p-toluenesulfonate, and the like; and triarylsulfonium salts such as triphenylsulfonium tetrafluoroborate, triphenylsulfonium hexafluorophosphonate, triphenylsulfonium hexafluoroarsenate, triphenylsulfonium methanesulfonate, triphenylsulfonium trifluoroacetate, triphenylsulfonium-p-toluene sulfonate, 4-methoxyphenyldiphenylsulfonium tetrafluoroborate, 4-methoxyphenyldiphenylsulfonium hexafluorophosphonate, 4-methoxyphenyldiphenylsulfonium hexafluoroarsenate, 4-methoxyphenyldiphenylsulfonium methanesulfonate, 4-methoxyphenyldiphenylsulfonium trifluoroacetate, 4-methoxyphenyldiphenylsulfonium-p-toluene sulfonate, 4-phenylthiophenyldiphenyl tetrafluoroborate, 4-phenylthiophenyldiphenyl hexafluorophosphonate, 4-phenylthiophenyldiphenyl hexafluoroarsenate, 4-phenylthiophenyldiphenyl trifluoromethanesulfonate, 4-phenylthiophenyldiphenyl trifluoroacetate, 4-phenylthiophenyldiphenyl-p-toluene sulfonate, and the like. Cationic photoinitiators that are onium salts can be used as photoacid generators.

Examples of trichloromethyl-s-triazines include tris(2,4,6-trichloromethyl)-s-triazine, 2-phenyl-bis(4,6-trichloromethyl)-s-triazine, 2-(3-chlorophenyl)-bis(4,6-trichloromethyl)-s-triazine, 2-(2-chlorophenyl)-bis(4,6-trichloromethyl)-s-triazine, 2-(4-methoxyphenyl)-bis(4,6-trichloromethyl)-s-triazine, 2-(3-methoxyphenyl)-bis(4,6-trichloromethyl)-s-triazine, 2-(2-methoxyphenyl)-bis(4,6-trichloromethyl)-s-triazine, 2-(4-methylthiophenyl)-bis(4,6-trichloromethyl)-s-triazine, 2-(3-methylthiophenyl)bis(4,6-trichloromethyl-s-triazine, 2-(2-methylthiophenyl)-bis(4,6-trichloromethyl)-s-triazine, 2-(4-methoxynaphtyl)-bis(4,6-trichloromethyl)-s-triazine, 2-(3-methoxynaphtyl)-bis(4,6-trichloromethyl)-s-triazine, 2-(2-methoxynaphtyl)-bis(4,6-trichloromethyl)-s-triazine, 2-(3,4,5-trimethoxy-β-styryl)-bis(4,6-trichloromethyl)-s-triazine, 2-(4-methylthio-β-styryl)-bis(4,6-trichloromethyl)-s-triazine, 2-(3-methylthio-β-styryl)-bis(4,6-trichloromethyl)-s-triazine, and 2-(2-methylthio-β-styryl)-bis(4,6-trichloromethyl)-s-triazine.

While many cationic photoinitiators can be used to generate photoacids, certain non-ionic compounds also can be used as photoacid generators. Both ionic and non-ionic photoacid generators often are used to induce photocrosslinking in polymers. Examples of non-ionic photoacid generators include triflic acid generators, nonaflic acid generators, and sulfonate (non-fluorinated) acid generators such as diazosulfonyl compounds, sulfonyloxy imides, nitrobenzyl sulfonate esters, and imidosulfonates, Specific examples include oxime esters such as 2-[2-(4-methylphenylsulfonyloxyimino)]-2,3-dihydrothiophen-3-ylidene]-2-(2-methylphenyl)acetonitrile (trade name "IRGACURE PAG 121" commercially available from BASF), [2-(propylsulfonyloxyimino)-2,3-dihydrothiophen-3-ylidene]-2-(2-methylphenyl)acetonitrile (trade name "IRGACURE PAG 103" commercially available from BASF), [2-(n-octanesulfonyloxyimino)-2,3-dihydrothiophen-3-ylidene]-2-(2-methylphenyl)acetonitrile (trade name "IRGACURE PAG 108" commercially available from BASF), α-(n-octanesulfonyloxyimino)-4-methoxybenzylcyanide (trade name "CGI 725" manufactured by commercially available from BASF), naphthalimide trifluoromethylsulfonate, 2-[2,2,3,3,4,4,4-heptafluoro-1-(nonafluorobutylsulfonyloxyimino)-butyl]-fluorene (trade name "CGI 1906" manufactured by commercially available from BASF); and CGI-1907: 2-[2,2,3,3,4,4,5,5-octafluoro-1-(nonafluorobutylsulfonyloxyimino)-pentyl]-fluorene (trade name "CGI 1907" manufactured by commercially available from BASF).

Anionic photoinitiators and photobase generators can be used to initiate the anionic polymerization or crosslinking of aldehydes, ketones, and certain ethylenically unsaturated monomers (e.g., ethylene, 1,3-dienes, styrene, meth(acrylates), cyanoacrylates, (meth)acrylonitrile, meth(acrylamide). Anionic photoinitiators also can be used to initiate the anionic ring-opening polymerization of a monomer or oligomer or the crosslinking of an oligomer or polymer that are selected from epoxides, siloxanes, cyclic esters, cyclic amides, and N-carboxy-α-amino anhydrides. Examples of anionic photoinitiators include various compounds that can generate an anionically charged nucleophile (e.g., $CN^-$, $I^-$, $Br^-$, $N_3^-$, $NO_2^-$, $Cl^-$, $F^-$, $SCN^-$, $OH^-$, and $OR^-$) upon irradiation. Specific examples include oxime esters, carbamates, 9-fluorenyl carbamates, ferrocenophanes, ammonium tetraorganyl borate salts, amidine based N-benzylated structures, aromatic formamides, cobalt-amine complexes, amine-imides, aminoketones, phosphzene bases, and dye leuconitriles.

In some embodiments, the photoactive compounds comprise a photosensitizer. In some embodiments, the photoactive compounds comprise a photoinitiator and a photosensitizer. The photosensitizer absorbs at an irradiation wavelength and then transfers either energy or an electron to the matrix-forming compound or the photoinitiator. For example, a photosensitizer can be added to a photocrosslinkable polymer that normally absorbs at 193 nm to make the polymer sensitive to 400 nm light. Some examples of photosensitizers include α-acyloxy esters, acylphosphine oxides, benzoins, benzophenones, thioxanthones, anthracenes, perylenes, tetracenes, acetophenones, phenothiazones, 1,2-benzathracenes, phenothiazines, phenanthrenes, chrysenes, coronenes, benzpyrenes, fluoranthenes, rubrenes, pyrenes, indanthrenes, anthraquinones, acridones, coumarins and ketocoumarins, and derivatives thereof. A combination of photosensitizers may be used. Specific examples include 4,4-bis(diethylamino)benzophenone, benzo[a]anthracene-7,12-dione, isopropyl-9H-thioxanthen-9-one, 2-chlorothioxanthen-9-one, and 1-chloro-4-propoxy-9H-thioxanthen-9-one.

In various embodiments, the photoinitiators, the photoacid generators, and the photosensitizers can be photoactive to exposure to wavelengths between about 200 nm and about 500 nm. In preferred embodiments, the photoinitiators, the photoacid generators, and the photosensitizers can be photoactive to exposure to G (435.8 nm), H (404.7 nm), or I (365.4 nm) line of the spectrum.

The photoactive compounds, collectively, can be present at about 8-40 wt % in the present composition. Individually, the weight ratio of each photoactive compound to the matrix-forming compounds can be up to about 30%. Typical formulations for preparing photocrosslinkable dielectrics known in the art usually have less than 10 wt % of photoinitiators, photoacid generators, and photosensitizers in total because their presence (as well as the presence of their photoproducts) is known to cause various deleterious effects to the dielectric properties to the resulting dielectrics. The present compositions can include a much larger amount of photoactive compounds (for example, as high as 40 wt %) compared to photocrosslinkable dielectrics known in the art, given that these photoactive compounds (and their photoproducts) can be effectively removed during the development step due to the presence of the organic fillers in the composition.

Solvent

Prior to irradiation, the matrix-forming compounds according to the present teachings generally are soluble in common organic solvents but can become significantly insoluble in the same solvents after undergoing polymerization or crosslinking. The change in solubility can be monitored by measuring the loss in film thickness by submerging a photocured film in the mother solvent used to cast the film. As used herein, a material is considered insoluble in a solvent when the material experiences a less than 5% thickness loss after being in the solvent for at least an hour.

More specifically, the matrix-forming compounds and the photoactive compounds disclosed herein (prior to irradiation and photoreaction) can have satisfactory solubility in various common organic solvents, thereby affording compositions that are suitable for solution-phase processes.

Examples of organic solvents that can be used to formulate the present polymers include, but are not limited to, aromatic hydrocarbon solvents such as benzene, cyclohexylbenzene, toluene, xylene, and mesitylene; aliphatic hydrocarbons such as hexanes, cyclopentane, cyclohexane, n-nonane, n-decane, n-undecane, n-dodecane; alcohol solvents such as methanol, ethanol, propanol, isopropanol, 1-butanol, 2-ethoxymethanol, 3-methoxypropanol, cyclopentanol, cyclohexanol, and heptanol; ketone solvents such as acetone, acetylacetone, methyl ethyl ketone, methyl isobutyl ketone, 2-butanone, 2-pentanone, 3-pentanone, 2-heptanone, 3-heptanone, cyclopentanone, and cyclohexanone; ester solvents such as ethyl acetate, propyl acetate, butyl acetate, isobutyl acetate, pentyl acetate, cyclohexyl acetate, heptyl acetate, ethyl propionate, propyl propionate, butyl propionate, isobutyl propionate, propylene glycol monomethyl ether acetate (PGMEA), methyl lactate, ethyl lactate and γ-butyrolactone; ether solvents such as diisopropyl ether, dibutyl ether, ethyl propyl ether, diethyl ether, bis(2-methoxyethyl) ether, dioxane, anisole, phenetole, and veratrole; and amide solvents such as N-methylpyrrolidinone, dimethyl formamide, and dimethylacetamide. Preferred solvents are ester solvents, particularly, propylene glycol monomethylether acetate. Any of these solvents can be used either singly or in combination.

Additives

In addition to the organic filler, the matrix-forming compound(s), photoactive compound(s), and the organic solvent(s), the present composition optionally also can include one or more additives. As described above, co-initiators can be one of these additives. In some embodiments, a small molecule crosslinkers may be included in the present composition. In some embodiments, a quencher may be included to neutralize excess photoacid generators. In some embodiments, an antioxidant (oxygen scavenger) can be included in the present composition to enhance its storage stability. Suitable antioxidants include phenols, phosphites, and thioethers. Particularly, examples of phenol-type antioxidants include 2-t-butyl-p-cresol, 2,6-di-t-butyl-p-cresol, 2,6-di-t-butyl-4-ethylphenol, 2,2'-methylenebis-(4-methyl-6-t-butylphenol, 2,2'-methylenebis-(4-ethyl-6-t-butylphenol, triethylene glycol bis[3-(3-(t-butyl-5-methyl-4-hydroxyphenyl) propionate], 1,6-hexanediol-bis[3-(3,5-di-t-butyl-5-methyl-4-hydroxyphenyl) propionate], pentaerythritol tetrakis[3-(3,5-di-t-butyl-5-methyl-4-hydroxyphenyl) propionate], octadecyl-3-(3,5-di-t-butyl-5-methyl-4-hydroxyphenyl) propionate or 1,3,5-trimethyl-2,4,6-tris(3,5-di-t-butyl-4-hydroxybenzyl)benzene; examples of phosphite-type antioxidants include triphenyl phosphite or tris(2,4-di-t-butylphenyl) phosphite; and examples of thioether-type antioxidants include bis(4-hydroxy-3-methylphenyl) sulfide, bis(4-hydroxyphenyl) sulfide, 4,4'-thiobis-(6-t-butyl-m-cresol, 4,4'-thiobis(6-t-butyl-o-cresol or 2,2'-thiobis-(4-t-octylphenol).

Other additives can include one or more surfactants, plasticizers, adhesion promoters, rheology modifiers, leveling agents, wetting agents, defoaming agents, stabilizers (e.g., radical stabilizers) and the like.

The composition described herein can be solution-processed into films having a thickness in the range of about 250 nm to about 50 where the films subsequently can be crosslinked via actinic (e.g., UV) radiation, into mechanically robust and ambient-stable materials suitable for use as a permanent layer in various electronic, optical, and optoelectronics devices. For example, the present materials can provide a photopatternable film having a thickness ranging from about 100 nm to about 50 from about 250 nm to about 25 from about 250 nm to about 1 and from about 400 nm to about 800 nm. The present material can be photopatterned at a resolution on the micrometer-range, and can have a contrast (γn) of about 0.2 to about 10.

The photopatternable materials according to the present teachings can be used (either by itself or with at least one other dielectric material) as the dielectric layer in a thin film transistor, as a passivation material (for example, to encapsulate the source and drain electrodes in a transistor), or as an etch-stop material (for example, to protect an underlying metal oxide semiconductor layer during the patterning (etching) step of the metal layer on top to define source and drain electrodes).

When used as a dielectric material, the present materials can exhibit a wide range of desirable properties and characteristics including, but not limited to, low leakage current densities, high breakdown voltages, low hysteresis, large capacitance values, uniform film thickness, solution-processability, fabricability at low temperatures and/or atmospheric pressures, thermal stability, air and moisture stability, resistance to harsh reagents, and/or compatibility with diverse gate materials and/or semiconductors. When used as passivation or interfacial materials, the present materials can exhibit desirable properties and characteristics including, but not limited to, high decomposition temperature, high optical clarity, low shrinkage, low moisture absorption, low oxygen penetration, uniform film thickness, solution-processability, fabricability at low temperatures and/or atmospheric pressures, and good adhesion to adjacent materials. When used as etch-stop materials, the present materials can exhibit desirable properties and characteristics including, but not limited to, chemical resistance to common wet etchants, photopatternability (without the need for photoresist, hence reducing manufacturing steps), high decomposition temperature, high optical clarity, low shrinkage, low moisture absorption, low oxygen penetration, uniform film thickness, solution-processability, fabricability at low temperatures and/or atmospheric pressures, and good adhesion to diverse adjacent materials (metal oxides, metals or metal alloys, and organic materials).

As used herein, "solution-processable" or "solution-processed" refers to the ability of a composition to be processed via various solution-phase processes. A solution-processable composition can be deposited on a substrate, such as an electrically conductive material (e.g., source, drain, or gate electrodes in a transistor) or a semiconductor material (e.g., the charge-carrying layer in a transistor), via various solution-phase deposition methods known in the art. In various embodiments, the solution-phase process can be selected from spin-coating, slot coating, printing (e.g., inkjet printing, screen printing, pad printing, offset printing, gravure printing, flexographic printing, lithographic printing, mass-printing and the like), spray coating, electrospray coating, drop casting, dip coating, and blade coating. Spin-coating involves applying an excess amount of the coating solution onto the substrate, then rotating the substrate at high speed to spread the fluid by centrifugal force. The thickness of the resulting film prepared by this technique can be dependent on the spin-coating rate, the concentration of the solution, as well as the solvent used. Printing can be performed, for example, with a rotogravure printing press, a flexoprinting press, pad printing, screen printing or an ink jet printer. The thickness of the resulting film as processed by these printing methods can be dependent on the concentration of the solution, the choice of solvent, and the number of printing repetitions. Ambient conditions such as temperature, pressure, and humidity also can affect the resulting thickness of the film. Depending on the specific printing techniques used, printing quality can be affected by different parameters including, but not limited to, rheological properties of the formulations/compositions such as tension energy and viscosity.

Films according to the present teachings can be photopatterned directly (without using a photoresist). Accordingly, a patterned layer can be formed by depositing a composition according to the present teachings to provide an uncrosslinked film, subjecting the uncrosslinked film to actinic radiation in an imagewise pattern such that the components in the photopatternable composition in exposed areas becomes crosslinked; and removing the unexposed areas (which remain uncrosslinked and soluble). More specifically, the process can include depositing a composition described herein to form a film of desired thickness, exposing the film to radiation (e.g., in the G (435.8 nm), H (404.7 nm), or I (365.4 nm) line of the spectrum) through a photomask (one having the desired imagewise pattern) to provide insoluble (e.g., crosslinked) areas and soluble (e.g., uncrosslinked) areas, and stripping the soluble areas. Films according to the present teachings are negative-tone, and can be developed by organic or aqueous developers. Subsequent to the formation of the crosslinked matrix, during or after the development step, the crosslinked film can be rinsed with an organic solvent (particularly, an ester solvent such as PGMEA) to extract the organic fillers as well as the photoactive compounds. The removal of the organic fillers and the photoactive compounds can be evidenced by film thickness loss. The removal of photoactive compounds can be evidenced further by absorption spectra. After the rinsing step, the photoactive compounds can be present in the film at less than 0.1 wt % (compared to the weight percentage of the photoactive compounds in the photopatternable composition, which is 5-30 wt %).

Accordingly, the present teachings also relate to a transistor having a patterned component, wherein the patterned component has less than 0.1 wt % of photoactive compounds and is prepared from a negative tone photoresist comprising at least 5 wt % of photoactive compounds. The transistor can be a field effect transistor (FET), and particularly, an organic field effect transistor or a metal oxide field effect transistor, that includes a thin film organic (small molecule or polymeric) or metal oxide semiconductor. A typical thin film transistor (TFT) includes a number of layers and can be configured in various ways. For example, a TFT generally includes a substrate, a gate dielectric, a semiconductor, source and drain electrodes connected to the semiconductor, and a gate electrode adjacent to the gate dielectric. When a potential is applied on the gate electrode, charge carriers are accumulated in the semiconductor at an interface with the dielectric. As a result, a conductive channel is formed between the source and drain electrodes and a current will flow if a potential is applied to the drain electrode.

Transistors described herein can be arranged in an array which can be used as switching devices or peripheral drivers in active matrix liquid crystal displays (AMLCDs) and as pixel drivers for active matrix organic light-emitting diodes (AMOLEDs).

The following examples are provided to illustrate further and to facilitate the understanding of the present teachings and are not in any way intended to limit the invention.

Example 1

Photocrosslinked films were prepared from a formulation according to the present teachings that includes an epoxy-functionalized photopolymer (poly(glycidyl methacrylate), PGMA, $M_n$~20,000, from Aldrich), a nonionic photoacid generator (N-hydroxynaphthalimide trifluoromethanesulfonate, NIT), a photosensitizer (a biscoumarin compound, CDIAC), and an organic filler (polyethylene glycol dimethyl ether, PEG, $M_n$~250) formulated in propylene glycol methyl ether acetate (PGMEA). A comparative formulation was prepared without the organic filler.

More specifically, the following formulations were prepared:

| Components | Formulation 1 | Comparative Formulation A |
|---|---|---|
| PGMA | 120 mg/mL | 120 mg/mL |
| NIT | 6 mg/mL | 6 mg/mL |
| CDIAC | 9.6 mg/mL | 9.6 mg/mL |
| PEG | 60 mg/mL | None |

Films having a thickness between about 400 nm and about 600 nm were spin-coated onto glass substrates, then photocured at 200 mJ or 600 mJ using a high pressure mercury lamp through a G&H line filter. The photocured films were soaked in PGMEA first for 30 s, then for another 30 s (for a total of 60 s).

Figure 2:
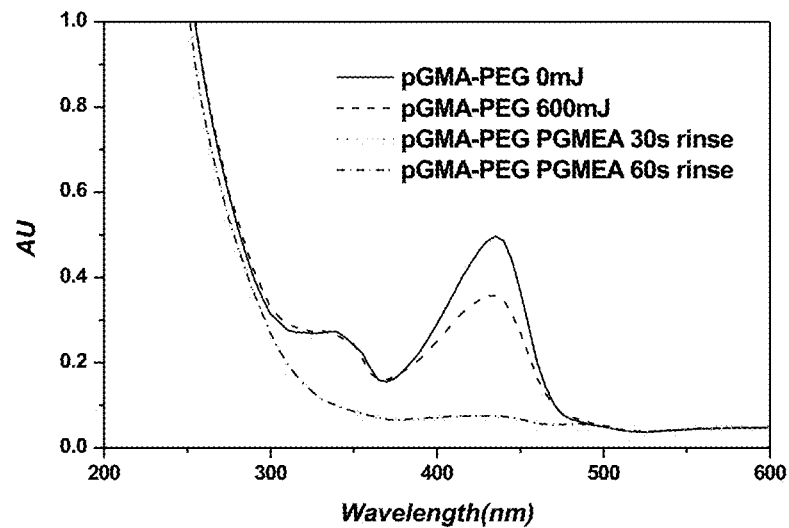
FIG. 2 compares the absorption spectra of thin films prepared from (a) a composition according to the present teachings that includes an epoxy-functionalized photopolymer, a photoacid generator, a photosensitizer, and an organic filler (PEG, $M_n$~250) formulated in propylene glycol methyl ether acetate, and (b) a comparative formulation without the organic filler, before and immediately after photocuring at 600 mJ, and after a 30 s or 60 s rinse in PGMEA post-curing.
Figure 2:
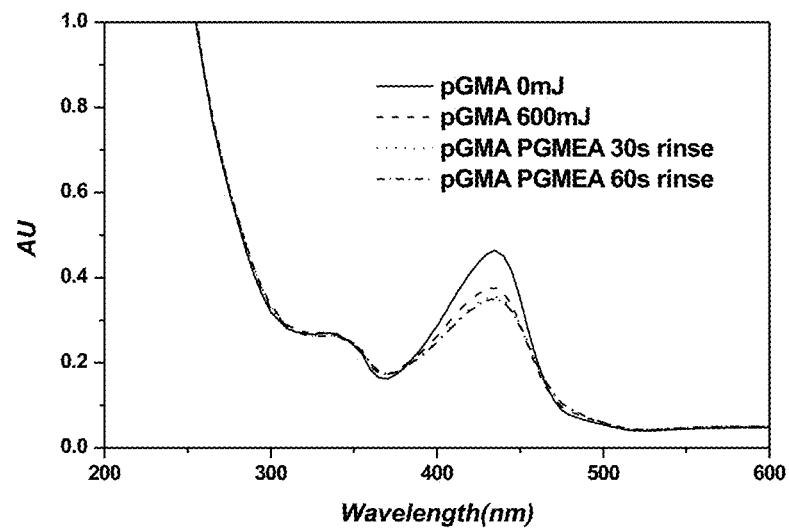

FIG. 1 shows the absorption spectra of film samples prepared from (a) Formulation 1 and (b) Comparative Formulation A before and immediately after photocuring at 200 mJ, and after a 30 s or 60 s rinse in PGMEA post-curing. FIG. 2 shows the absorption spectra of film samples prepared from (a) Formulation 1 and (b) Comparative Formulation A before and immediately after photocuring at 600 mJ, and after a 30 s or 60 s rinse in PGMEA post-curing.

As shown in both FIGS. 1 and 2, absorption peaks corresponding to the photoacid generator and the photosensitizer can be observed at around 340 nm and around 440 nm before and immediately after curing. In FIGS. 1(a) and 2(a), those two peaks disappeared after rinsing in PGMEA, confirming that the addition of an organic filler in the formulation enables the effective removal of the photoacid generator and the photosensitizer from the photocured films. By comparison, FIGS. 1(b) and 2(b) show that when no organic filler is included in the formulation, the photoacid generator and the photosensitizer remain present in the photocured films despite the same amount of rinsing in PGMEA.

The generality of the present teachings was confirmed in the following experiment where an organic filler was added to a commercially available photoresist. Specifically, 100 wt. % (150 mg/mL) of PEG was added to a commercial SU-8 2000.5 photoresist formulation (Microchem, Newton, Mass.). Films having a thickness between about 400 nm and about 600 nm were spin-coated onto glass substrates, then photocured using a UV flood exposure system for 10 s, baked for 5 min at 90° C., then rinsed with PGMEA for 30 s, then for another 30 s (for a total of 60 s).

Figure 3:
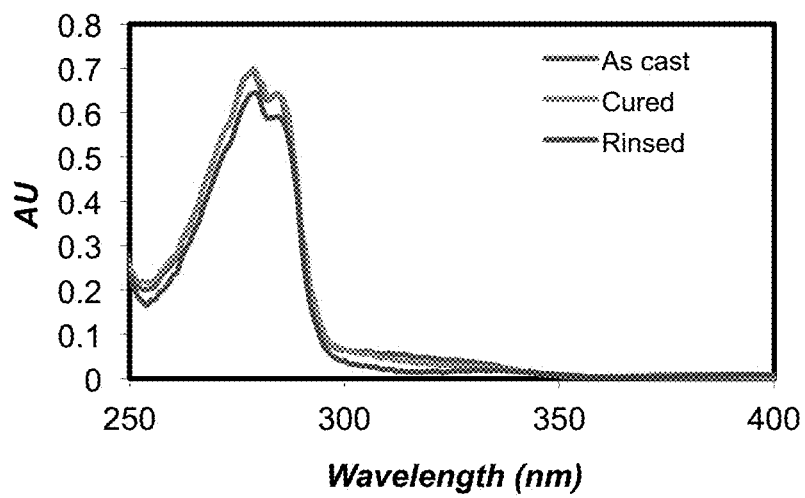
FIG. 3 compares absorption spectra obtained from thin films prepared from (a) a composition according to the present teachings (specifically, a commercially available photoresist formulation modified with the addition of an organic filler) and (b) the unmodified commercially available photoresist formulation.
Figure 3:
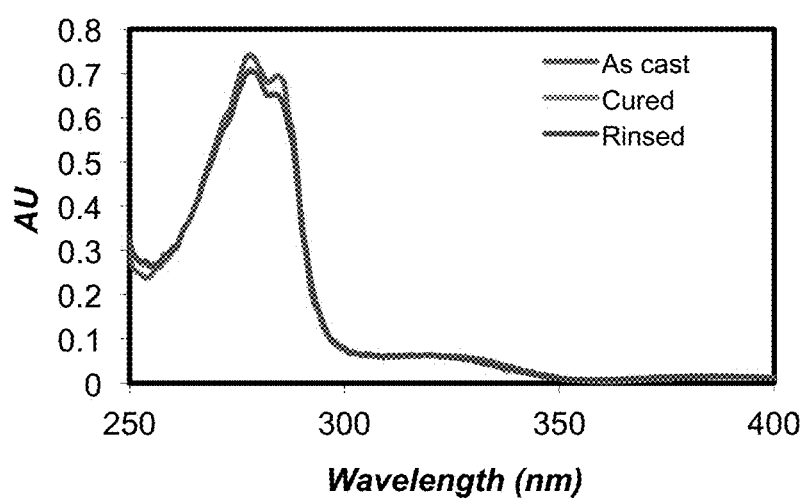

FIG. 3 shows their absorption spectra. It can be seen from FIG. 3(a) that for photocrosslinked films prepared from the PEG-modified formulation, it was possible to remove residues of photoactive compounds by rinsing the films with PGMEA. Specifically, absorption due to triarylsulfonium salts (250-350 nm) was noticeably reduced after rinsing. By comparison, and as shown in FIG. 3(b), for photocrosslinked films prepared from the unmodified formulation, no changes in absorption were observed at 250-350 nm after the rinsing step.

Example 2

Transistor devices having a photo-patterned dielectric prepared from a formulation according to the present teachings (Formulation 2) were fabricated.

More specifically, Formulation 2 was prepared with epoxycyclohexyl ethyl polyhedral oligomeric silsesquioxane (ECPOSS, Hybrid Plastic EP0408, cage content ≥50%), a nonionic photoacid generator (N-hydroxynaphthalimide trifluoromethanesulfonate, NIT), a photosensitizer (a bis-coumarin compound, CDIAC), and an organic filler ((±)-α-Tocopherol, VE) formulated in propylene glycol methyl ether acetate (PGMEA).

| Components | Amount |
|---|---|
| ECPOSS | 200 mg/mL |
| CDIAC | 10 mg/mL |
| NIT | 10 mg/mL |
| VE | 100 mg/mL |

Top-gate bottom-contact organic thin film transistors were fabricated on glass substrates (Eagle™ 2000 from Corning Inc., Corning, N.Y.) pre-treated with a polymeric planarization layer. Ag electrodes were deposited through shadow masks to a thickness of 50 nm, then treated with a surface modifier layer. The active semiconductor layer was formed by spin-coating a perylene diimide small molecule OSC over the Ag contacts, followed by a baking step at 110° C. for 5 min. The gate dielectric was prepared by spin-coating either Formulation 2 at 800 rpm for 90 s. Pre-baking was carried out at 90° C. for 30 s to evaporate the solvent, thereby providing a film of about 400-600 nm in thickness. Photocrosslinking was achieved by GH line exposure (200 mJ/cm$^2$), followed by a post-baking step at 120° C. for 10 minutes. A post-curing rinsing step was performed with PGMEA for 30 s for some of the devices. Finally, the gate electrode was formed by thermal deposition of Ag.

Figure 4:
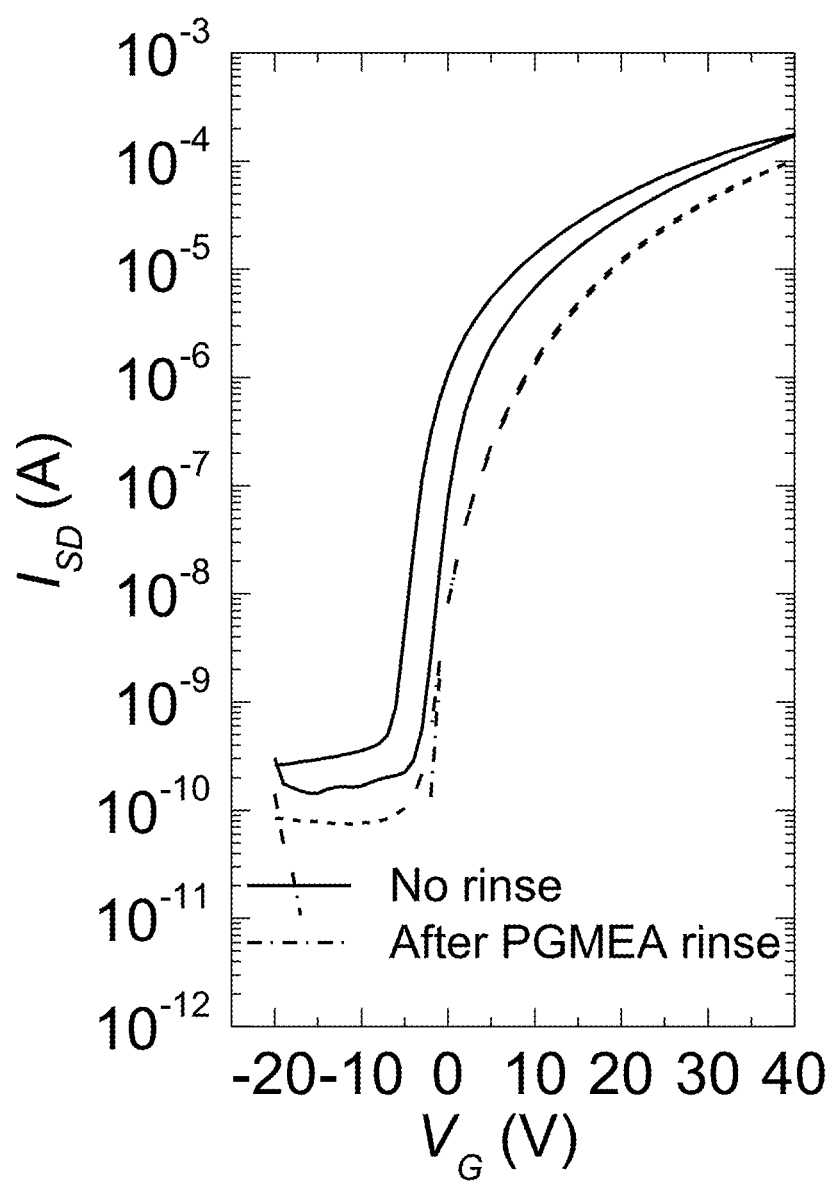
FIG. 4 compares the transfer characteristics of a representative transistor device having a photopatterned dielectric component according to the present teachings from which photoactive compounds have been removed (via a post-curing rinsing step, dashed line) versus the transfer characteristics of a comparison device having a photopatterned dielectric component in which photoactive compounds remain (no post-curing rinsing step, solid line).

FIG. 4 compares the transfer characteristics of the tested devices. Specifically, the solid line shows the transfer characteristics of a representative device completed without the rinsing step. As shown, anticlockwise hysteresis was observed with these devices. By comparison, in devices where the post-curing rinsing step was performed, because the photoactive compounds CDIAC and NIT were effectively removed with the assistance of the organic filler VE (dashed line), no hysteresis was observed and the devices showed much better stability in operation compared to the devices that were completed without the rising step (and in which the photoactive compounds remained).

All publications, including but not limited to patents and patent applications, cited in this specification are herein incorporated by reference as if each individual publication were specifically and individually indicated to be incorporated by reference herein as though fully set forth.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A method for forming a photopatterned dielectric component in a transistor device, the method comprising:
depositing a photopatternable composition onto a substrate to provide a thin film, the photopatternable composition comprising:
one or more matrix-forming compounds,
one or more photoactive compounds,
an organic filler, and
an organic solvent or solvent mixture;
exposing the thin film to imagewise irradiation in an imagewise pattern, thereby causing the one or more matrix-forming compounds in exposed areas of the thin film to form a polymerized or crosslinked matrix that is insoluble in the organic solvent or solvent mixture while allowing the one or more matrix-forming compounds in unexposed areas of the thin film to remain uncrosslinked;
removing unexposed areas of the thin film with a developer to provide a photopatterned dielectric component; and
rinsing the photopatterned dielectric component with the organic solvent or solvent mixture to remove the photoactive compounds, wherein after the rinsing step, the total weight of photoactive compounds remaining in the photopatterned dielectric component is less than about 5% of the total weight of photoactive compounds in the photopatternable composition,
wherein the organic filler has a minimum solubility of about 25 mg/mL in the organic solvent or solvent mixture.

2. The method of claim 1, wherein the photoactive compounds are adapted to initiate, promote, and/or sensitize a photochemical reaction in which the matrix-forming compounds form the polymerized or crosslinked matrix, and wherein the organic filler is inert in such photochemical reaction and is soluble or miscible in the organic solvent or solvent mixture both before and after such photochemical reaction.

3. The method of claim 1, wherein the organic solvent or solvent mixture comprises an ester solvent, an alcohol solvent, a ketone solvent, or a combination thereof.

4. The method of claim 3, wherein the organic solvent or solvent mixture comprises one or more of ethyl lactate, ethyl 3-ethoxy propionate, propylene glycol methyl ether acetate, and methyl n-amyl ketone.

5. The method of claim 1, wherein the organic filler has a molecular weight between about 200 g/mol and about 2500 g/mol.

6. The method of claim 1, wherein the organic filler has a boiling point between about 200° C. and about 700° C.

7. The method of claim 1, wherein the organic filler is selected from the group consisting of bis-methoxylated poly(alkylene glycols), bis-ethoxylated poly(alkylene glycol)s and their fluorinated derivatives.

8. The method of claim 1, wherein the organic filler is a polyethylene glycol dimethyl ether having a number average molecular weight ($M_n$) of 200 g/mol, 250 g/mol, 300 g/mol, 400 g/mol, or 500 g/mol.

9. The method of claim 1, wherein the organic filler is a compound having a cyclic ring at one end and a lipophilic chain at the other end, wherein the lipophilic chain has at least 8 carbon atoms.

10. The method of claim 1, wherein in the photopatternable composition the matrix-forming compounds are present at about 5-30 wt %, the photoactive compounds are present at about 8-40 wt %, the organic filler is present at about 5-30 wt %, and the organic solvent or solvent mixture is present at about 50-85 wt %.

11. The method of claim 1, wherein the matrix-forming compounds comprise oligomers or polymers functionalized with a photocrosslinkable group, the photocrosslinkable group being a functional group comprising a double bond, a triple bond, a heterocyclic addition-polymerizable group, or a precursor capable of in-situ formation of a double or triple bond or a heterocyclic addition-polymerizable radical.

12. The method of claim 11, wherein the photocrosslinkable group comprises a vinyl moiety, an allyl moiety, an ethynyl moiety, a dienyl moiety, an acrylate moiety, a cinnamate moiety, a coumarinyl moiety, a benzocyclobutane moiety, an epoxy or oxirane moiety, an oxetane moiety, or a thiirane moiety.

13. The method of claim 12, wherein the matrix-forming compounds comprise a dielectric polymer selected from the group consisting of poly(vinyl phenol), poly(vinyl acetate), poly(vinyl alcohol), poly(acrylate), poly(methacrylate), poly(methyl methacrylate), polystyrene, poly(ethylene amine), polymaleimide, polyimide, polysulfone, siloxane polymer, phenol formaldehyde (Novolac) resin, a benzoxazole polymer, poly(oxadiazole), maleic anhydride polymer, and copolymers thereof, and wherein the photocrosslinkable group is attached as pendant groups.

14. The method of claim 13, wherein the photoactive compounds comprise a photoacid generator, a photosensitizer, or both.

15. The method of claim 1, wherein the matrix-forming compounds comprise one or more photopolymerizable monomers or oligomers.

16. The method of claim 15, wherein the one or more photopolymerizable monomers or oligomers are selected from the group consisting of (i) monofunctional and/or polyfunctional acrylate monomers and oligomers, (ii) monofunctional and/or polyfunctional epoxy or epithio monomers and oligomers, (iii) monomeric styrene and oligomeric acrylates, (iv) thiol-ene monomers and oligomers, (v) acrylate- and/or epoxy-functionalized polyhedral oligomeric silsesquioxanes, (vi) monofunctional and/or polyfunctional maleimide monomers and oligomers, and (vii) mixtures thereof.

17. The method of claim 16, wherein the photoactive compounds comprise a photoinitiator and optionally a photosensitizer.

18. The method of claim 17, wherein the composition further comprises a co-initiator.

19. The method of claim 1, wherein the photoactive compounds are photoactive upon irradiation at wavelengths between about 200 nm and about 500 nm.

20. The method of claim 19, wherein the photoactive compounds are photoactive upon exposure to G (435.8 nm), H (404.7 nm) or I (365.4 nm) line irradiation.

21. The method of claim 1 comprising soft-baking the thin film before the exposing step at a temperature between about 100° C. and about 150° C. for a period of time between about 30 seconds and 5 minutes, wherein after such soft-baking step, the thin film retains more than 90% by weight of the organic filler but less than 20% by weight of the organic solvent or solvent mixture compared to the photopatternable composition.

22. The method of claim 1, wherein after the rinsing step, the total weight of photoactive compounds remaining in the photopatterned dielectric component is less than about 2% of the total weight of photoactive compounds in the photopatternable composition.

23. The method of claim 1, wherein after the rinsing step, the total weight of photoactive compounds remaining in the photopatterned dielectric component is less than about 1% of the total weight of photoactive compounds in the photopatternable composition.

* * * * *